US010645804B2

(12) United States Patent
Matsuura et al.

(10) Patent No.: US 10,645,804 B2
(45) Date of Patent: May 5, 2020

(54) ADHESIVE FILM, MULTILAYER PRINTED WIRING BOARD USING ADHESIVE FILM, AND METHOD FOR MANUFACTURING MULTILAYER PRINTED WIRING BOARD

(75) Inventors: Masaharu Matsuura, Ibaraki (JP); Nobuyuki Ogawa, Ibaraki (JP); Hiroaki Fujita, Ibaraki (JP); Hiroyuki Fukai, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 1221 days.

(21) Appl. No.: 14/128,935

(22) PCT Filed: Jul. 6, 2012

(86) PCT No.: PCT/JP2012/067395
§ 371 (c)(1),
(2), (4) Date: Feb. 21, 2014

(87) PCT Pub. No.: WO2013/005847
PCT Pub. Date: Jan. 10, 2013

(65) Prior Publication Data
US 2014/0199533 A1    Jul. 17, 2014

(30) Foreign Application Priority Data

Jul. 7, 2011  (JP) .................................. 2011-151119
Aug. 5, 2011  (JP) .................................. 2011-172338
Aug. 5, 2011  (JP) .................................. 2011-172340

(51) Int. Cl.
| | |
|---|---|
| H05K 1/03 | (2006.01) |
| C08G 59/50 | (2006.01) |
| C09J 7/20 | (2018.01) |
| H05K 3/46 | (2006.01) |
| C09J 163/00 | (2006.01) |
| C09J 11/04 | (2006.01) |
| H05K 3/00 | (2006.01) |

(52) U.S. Cl.
CPC ....... *H05K 1/0306* (2013.01); *C08G 59/5086* (2013.01); *C09J 7/20* (2018.01); *C09J 11/04* (2013.01); *C09J 163/00* (2013.01); *H05K 3/0064* (2013.01); *H05K 3/4673* (2013.01); *H05K 2201/0195* (2013.01); *H05K 2201/0209* (2013.01); *Y10T 428/24967* (2015.01); *Y10T 428/25* (2015.01); *Y10T 428/254* (2015.01); *Y10T 428/259* (2015.01); *Y10T 428/2848* (2015.01)

(58) Field of Classification Search
CPC .......... C09J 7/02; C09J 11/04; C08G 59/5086
See application file for complete search history.

(56) References Cited

U.S. PATENT DOCUMENTS

| | | | |
|---|---|---|---|
| 2003/0069331 A1 | 4/2003 | Teiichi et al. | |
| 2006/0100315 A1 | 5/2006 | Inada et al. | |
| 2006/0106166 A1 | 5/2006 | Inada et al. | |
| 2007/0036971 A1 | 2/2007 | Inada et al. | |
| 2009/0104429 A1* | 4/2009 | Goto ...................... | B32B 27/06 |
| | | | 428/319.3 |
| 2009/0186955 A1 | 7/2009 | Inada et al. | |
| 2009/0314532 A1 | 12/2009 | Hayashi et al. | |
| 2010/0065315 A1 | 3/2010 | Kimura | |
| 2010/0256313 A1 | 10/2010 | Nakamura et al. | |
| 2011/0021005 A1 | 1/2011 | Inada et al. | |
| 2011/0187006 A1 | 8/2011 | Inada et al. | |
| 2011/0217512 A1 | 9/2011 | Heishi et al. | |
| 2011/0278053 A1 | 11/2011 | Hayashi et al. | |
| 2012/0077401 A1* | 3/2012 | Kotake ................... | B32B 27/38 |
| | | | 442/147 |

(Continued)

FOREIGN PATENT DOCUMENTS

| | | |
|---|---|---|
| CN | 1400993 A | 3/2003 |
| CN | 1727429 A | 2/2006 |

(Continued)

OTHER PUBLICATIONS

Office Action dated Feb. 22, 2016, for Taiwanese Application No. 101124564.

(Continued)

*Primary Examiner* — Victor S Chang
(74) *Attorney, Agent, or Firm* — Fitch, Even, Tabin & Flannery, LLP

(57) ABSTRACT

An adhesive film according to the present invention includes a resin composition layer (layer A) for an interlayer insulating layer, a thermosetting resin composition layer (layer B), and a support film (layer C), and the layer C, the layer A, and the layer B are sequentially arranged in this order. The layer A is a resin composition which contains a thermosetting resin (a1) and an inorganic filler (b1) having a specific surface area of 20 m²/g or more, and the mass ratio of the thermosetting resin (a1) to the inorganic filler (b1) is within the range from 30:1 to 2:1. The layer B contains a thermosetting resin composition which is in a solid state at a temperature lower than 40° C. but melts at a temperature of 40° C. or higher but lower than 140° C. Consequently, the adhesive film according to the present invention can solve problems in a laser process and a desmear removal process following the laser process and can form a conductor layer which has a high adhesion strength even on an interlayer insulating layer having a smooth surface-roughened state.

12 Claims, No Drawings

(56) References Cited

U.S. PATENT DOCUMENTS

| | | | |
|---|---|---|---|
| 2012/0080808 A1 | 4/2012 | Inada et al. |
| 2014/0199533 A1 | 6/2014 | Matsuura et al. |
| 2014/0332984 A1 | 11/2014 | Inada et al. |

FOREIGN PATENT DOCUMENTS

| | | | |
|---|---|---|---|
| CN | 101608053 A | 12/2009 |
| JP | 1-99288 | 4/1989 |
| JP | 7-304931 | 11/1995 |
| JP | 11-1547 | 1/1999 |
| JP | 2002-3075 | 1/2002 |
| JP | 2003-277579 | 10/2003 |
| JP | 2005-39247 | 2/2005 |
| JP | 2006-37083 | 2/2006 |
| JP | 2008-265069 A | 11/2006 |
| JP | 2006-527920 | 12/2006 |
| JP | 2007-87982 | 4/2007 |
| JP | 2008-130796 | 6/2008 |
| JP | 2009-119855 | 6/2009 |
| JP | 2009-280758 | 12/2009 |
| JP | 2010-1403 | 1/2010 |
| JP | 2010-135477 | 6/2010 |
| JP | 2010-260971 | 11/2010 |
| JP | 2011-86729 | 4/2011 |
| JP | 2013-035930 A | 2/2013 |
| TW | 200914530 A | 4/2009 |
| TW | 201012652 A1 | 4/2010 |
| WO | WO 03/047324 A1 | 6/2003 |
| WO | WO 2005/001932 A1 | 1/2005 |
| WO | 2008044552 | 4/2008 |
| WO | WO 2010/50472 A1 | 5/2010 |

OTHER PUBLICATIONS

Official Office Action in JP 2011-151119, dated Dec. 25, 2014.
Office Action dated Mar. 31, 2016, for counterpart Chinese Application No. 201280032169.4.
Office Action dated Sep. 27, 2016, for Japanese Application No. 2015-248355.
Decision to Grant a Patent dated May 29, 2015, for Japanese Application No. 2011-151119, together with English language translation thereof.
Notification of Reasons for Refusal dated Dec. 25, 2014, for Japanese Application No. 2011-151119, together with English language translation thereof.
Written Amendment dated Mar. 6, 2015, for Japanese Application No. 2011-151119, together with English language translation thereof.
Written Argument dated Mar. 6, 2015, for Japanese Application No. 2011-151119, together with English language translation thereof.
Decision to Grant a Patent dated Sep. 16, 2015, for Japanese Application No. 2011-172338, together with English language translation thereof.
Notification of Reasons for Refusal dated Feb. 5, 2015, for Japanese Application No. 2011-172338, together with English language translation thereof.
Written Amendment dated May 11, 2015, for Japanese Application No. 2011-172338, together with English language translation thereof.
Written Argument dated May 11, 2015, for Japanese Application No. 2011-172338, together with English language translation thereof.
Decision of Refusal dated Sep. 17, 2015, for Japanese Application No. 2011-172340, together with English language translation thereof.
Decision to Grant a Patent dated Jan. 20, 2016, for Japanese Application No. 2011-172340, together with English language translation thereof.
Notification of Reasons for Refusal dated Feb. 6, 2015, for Japanese Application No. 2011-172340, together with English language translation thereof.
Written Amendment dated May 11, 2015, for Japanese Application No. 2011-172340, together with English language Translation thereof.
Written Amendment dated Dec. 21, 2015, for Japanese Application No. 2011-172340, together with English language translation thereof.
Written Argument dated May 11, 2015, for Japanese Application No. 2011-172340, together with English language translation thereof.
Japanese Official Action related to Japanese Application No. JP 2011-172340.

* cited by examiner

ADHESIVE FILM, MULTILAYER PRINTED WIRING BOARD USING ADHESIVE FILM, AND METHOD FOR MANUFACTURING MULTILAYER PRINTED WIRING BOARD

TECHNICAL FIELD

The present invention relates to an adhesive film, which is used for a multilayer printed wiring board of a build-up system, can form a conductor layer having a high adhesion strength even on an interlayer insulating layer having a smooth surface-roughened state, and has excellent laser processability, excellent via shape property after a desmear process, etc., a multilayer printed wiring board using the adhesive film, and a method for manufacturing the multilayer printed wiring board.

BACKGROUND ART

Accompanying the reduction in the size and weight and the increase in the functions of electronic apparatuses, further reduction in the size of integrated circuits and increase in the degree of integration of circuit boards have been demanded. In view of this, there has been proposed a multilayer printed wiring board having a multilayer circuit board. As one example of a method for manufacturing a multilayer printed wiring board, a build-up system is exemplified (see PTL 1 to PTL 3).

In the build-up system, an adhesive film having an insulating property is laminated on a circuit board, followed by heating, thereby curing an insulating layer of the adhesive film, and thereafter, a via-hole is formed by a laser process or the like. Subsequently, by using an alkaline permanganate or the like, a surface roughening treatment and a treatment of removing a smear remaining in the via-hole (referred to as a desmear treatment) are performed. Subsequently, the surface of the multilayer printed wiring board and the inside of the via-hole are subjected to an electroless copper plating treatment to form a conductor layer, and further, a circuit pattern is formed on the insulating layer having the conductor layer formed thereon. Then, on the circuit board having the circuit pattern formed thereon, the adhesive film is laminated, and the formation of a via-hole and the formation of a conductor layer are repeated. By doing this, a multilayer printed wiring board can be manufactured.

In this method, the adhesion strength between the adhesive film laminated on the circuit board and the conductor layer is ensured by the surface roughness (irregular shape) obtained by roughening the surface of the insulating layer of the adhesive film and the anchor effect between the roughened surface of the insulating layer and the conductor layer flowing therein. Due to this, the surface roughness of the surface of the insulating layer of the adhesive film is 0.6 µm or more.

However, in a conventional multilayer printed wiring board in which the adhesion strength between the insulating layer of the adhesive film and the conductor layer is dependent on the anchor effect, if the wiring width in the printed wiring which is the conductor layer is less than 10 µm, short circuit (so-called short circuit failure) of the printed wiring, disconnection (so-called open circuit failure) of the printed wiring, or the like is likely to occur.

Therefore, in order to miniaturize a printed wiring formed on a circuit board, a method capable of ensuring the adhesion strength between the conductor layer and even an interlayer insulating layer having a smooth surface-roughened state by a method different from a conventional joining method dependent on the anchor effect has been demanded.

In connection with this, there has been proposed an adhesive film of a multilayer printed wiring board configured to have a "two-layer structure". That is, a layer in charge of adhesion for ensuring adhesion between an insulating layer of an adhesive film and a conductor layer, and a layer in charge of embedment for ensuring an insulating property by embedding a wiring are provided (see PTL 4). In PTL 4, with the aim of ensuring stronger adhesiveness to an electroless copper plating than a conventional technique, an adhesive film having a two-layer structure including a layer in charge of adhesion containing an electroless copper plating and an insulating resin layer is also disclosed. However, this disclosure does not aim at smoothing the surface roughness, or meet the recent demand for miniaturization of a printed wiring.

Further, there has been proposed a resin composition capable of obtaining a roughened surface by roughening/desmear treatment so that an adhesion strength between an insulating layer of an adhesive film and a conductor layer can be ensured (see PTL 5). However, the roughening of the surface of the adhesive film proceeds as the desmear treatment proceeds by the conventional roughening/desmear treatment, and therefore, it is difficult to keep an interlayer insulating layer of the adhesive film smooth while sufficiently performing the desmear treatment. In addition, depending on the surface roughness of the interlayer insulating layer of the adhesive film or the adhesiveness between the insulating layer of the adhesive film and the conductor layer, swelling of the conductor layer (so-called blister defects) may sometimes be caused to increase the difficulty in production. In this manner, even the technique disclosed in PTL 5 does not sufficiently meet the recent demand for miniaturization of a printed wiring board.

Further, with respect to a build-up layer formed by a build-up process, in order to ensure the processing dimensional stability and also to reduce the amount of warpage after mounting a semiconductor, the reduction in thermal expansion coefficient has been demanded. As the most mainstream method therefor, a method in which a silica filler is highly filled is exemplified. For example, by incorporating a silica filler in an amount of 40% by mass or more in the build-up layer, the thermal expansion coefficient of the build-up layer is reduced (see, for example, PTL 6 to PTL 8).

CITATION LIST

Patent Literature

PTL 1: JP-A-7-304931
PTL 2: JP-A-2002-3075
PTL 3: JP-A-11-1547
PTL 4: JP-A-1-99288
PTL 5: JP-A-2005-39247
PTL 6: JP-T-2006-527920
PTL 7: JP-A-2007-87982
PTL 8: JP-A-2009-280758

SUMMARY OF INVENTION

Technical Problem

An object of the present invention is to provide an adhesive film, which is used for a multilayer printed wiring board of a build-up system, can solve the problems in a laser process and a desmear removal process following the laser process and also can form a conductor layer having a high adhesion strength even on an interlayer insulating layer having a smooth surface-roughened state, is hardly roughened by a desmear treatment, and hardly cause blister defects, a multilayer printed wiring board using the adhesive film, and a method for manufacturing the multilayer printed wiring board.

Solution to Problem

As a result of investigations to achieve the above object, the present inventors found that a resin composition in which an inorganic filler having a specific surface area of 20 $m^2/g$ or more is blended in a thermosetting resin at a specific ratio excels as an interlayer insulating material for a multilayer printed wiring board from the viewpoint of the laser processability of an interlayer insulating layer and the via shape property after a smear removal process following the laser process, and also from the viewpoint of the roughening property, and by forming an adhesive film having as a main structure, a two-layer structure including this resin composition and a specific thermosetting resin composition layer, a multilayer printed wiring board which excels in the laser processability of an interlayer insulating layer and the roughening property can be manufactured easily by a build-up process.

That is, the present invention includes the content of the following <1>.

<1> An adhesive film including a resin composition layer (layer A) for an interlayer insulating layer, a thermosetting resin composition layer (layer B), and a support film (layer C), wherein the layer C, the layer A, and the layer B are sequentially arranged in this order, the layer A is a resin composition which contains a thermosetting resin (a1) and an inorganic filler (b1) having a specific surface area of 20 $m^2/g$ or more, the mass ratio of the thermosetting resin (a1) to the inorganic filler (b1) is within the range from 30:1 to 2:1, and the layer B contains a thermosetting resin composition which is in a solid state at a temperature lower than 40° C. but melts at a temperature of 40° C. or higher but lower than 140° C.

Further, as a result of investigations to achieve the above object, the present inventors found that a resin composition in which a heat-resistant resin which dissolves in an organic solvent, a thermosetting resin, a filler, and a resin having a polysiloxane backbone are blended at a specific ratio is hardly roughened by a desmear treatment in a step of manufacturing a multilayer printed wiring board, and therefore can be preferably used for joining with a circuit board and joining with a conductive layer.

That is, the present invention includes the content of the following <2>.

<2> An adhesive film including a resin composition layer (layer A) for an interlayer insulating layer, a thermosetting resin composition layer (layer B), and a support film (layer C), wherein the layer C, the layer A, and the layer B are sequentially arranged in this order, the layer A is a resin composition which contains: (a) at least one resin which dissolves in an organic solvent and is selected from a polyimide resin, a polyamideimide resin, a polyamide resin, a polyetherimide resin, and a polybenzoxazole resin; (b) a thermosetting resin; (c) a filler; and (d) a resin having a polysiloxane backbone, the ratio of the mass of the component (a) to the mass of the component (b) is from 1:2 to 1:20, the ratio of the total mass of the components (a) and (b) to the mass of the component (c) is from 20:1 to 2:1, the ratio of the mass of the component (d) to the mass of the component (a) is from 1:1000 to 2:5, the total blending amount of the components (a) to (d) with respect to 100 parts by mass of the resin composition is 70 parts by mass or more, and the layer B contains a thermosetting resin composition which is in a solid state at a temperature lower than 40° C. but melts at a temperature of 40° C. or higher but lower than 140° C.

Further, as a result of investigations to achieve the above object, the present inventors found that a resin composition in which a heat-resistant resin which dissolves in an organic solvent, a thermosetting resin, a filler, and a phenoxy resin are blended at a specific ratio is hardly roughened by a desmear treatment in a step of manufacturing a multilayer printed wiring board, and also hardly causes blister defects, and therefore can be preferably used for joining with a circuit board and joining with a conductive layer.

That is, the present invention includes the content of the following <3>.

<3> An adhesive film including a resin composition layer (layer A) for an interlayer insulating layer, a thermosetting resin composition layer (layer B), and a support film (layer C), wherein the layer C, the layer A, and the layer B are sequentially arranged in this order, the layer A is a resin composition which contains: (a) at least one resin which dissolves in an organic solvent and is selected from a polyimide resin, a polyamideimide resin, a polyamide resin, a polyetherimide resin, and a polybenzoxazole resin; (b) a thermosetting resin; (c) a filler; and (e) a phenoxy resin, the ratio of the mass of the component (a) to the mass of the component (b) is from 1:0.5 to 1:50, the ratio of the total mass of the components (a) and (b) to the mass of the component (c) is from 1:0.02 to 1:0.5, the ratio of the mass of the component (e) to the mass of the component (a) is from 1:0.2 to 1:10, the total blending amount of the components (a), (b), (c), and (e) with respect to 100 parts by mass of the resin composition is 70 parts by mass or more, and the layer B contains a thermosetting resin composition which is in a solid state at a temperature lower than 40° C. but melts at a temperature of 40° C. or higher but lower than 140° C.

Further, the present invention includes the contents of the following <4> and <5>.

<4> A multilayer printed wiring board using any of the adhesive films in the above <1> to <3>.

<5> A method for manufacturing a multilayer printed wiring board including the following steps (1) to (6):

step (1): a step of laminating the adhesive film of the above <1> to <3> on one surface or both surfaces of a circuit board;

step (2): a step of forming an insulating layer by thermally curing the layer A and the layer B constituting the adhesive film in the circuit board having the adhesive film laminated thereon;

step (3): a step of forming a hole in the circuit board having the insulating layer formed thereon;

step (4): a step of removing a residue of the adhesive film remaining in the hole;

step (5): a step of forming a conductor layer on the circuit board from which the residue has been removed; and step (6): a step of forming a circuit pattern on the insulating layer having the conductor layer formed thereon, wherein the method includes a step of peeling off or removing the layer C after any of the steps (1), (2), and (3).

Advantageous Effects of Invention

According to the present invention, an adhesive film, which is used for a multilayer printed wiring board of a build-up system, can solve the problems in a laser process and a desmear removal process, and also can form a conductor layer having a high adhesion strength even on an interlayer insulating layer having a smooth surface-roughened state, is hardly roughened by a desmear treatment, and hardly cause blister defects, a multilayer printed wiring board using the adhesive film, and a method for manufacturing the multilayer printed wiring board can be provided.

DESCRIPTION OF EMBODIMENTS

[First Embodiment of Adhesive Film]

The adhesive film for a multilayer printed wiring board of the present invention is configured such that a resin composition layer (layer A) for an interlayer insulating layer, a thermosetting resin composition layer (layer B), and a layer composed of a support film (layer C), are sequentially arranged in the order of the layer C, the layer A, and the layer B, and has the following characteristics.

The layer A is a resin composition which contains a thermosetting resin (a1) and an inorganic filler (b1) having a specific surface area of 20 m$^2$/g or more in an amount such that the mass ratio of the thermosetting resin (a1) to the inorganic filler (b2) is within the range from 30:1 to 2:1.

The layer B is a resin composition containing a thermosetting resin (a2) which is in a solid state at a temperature lower than 40° C. but melts at 40° C. to 140° C.

Incidentally, the circuit board in the present invention refers mainly to an article in which a conductor layer and a circuit pattern are formed by a printed wiring technique or the like on one surface or both surfaces of a substrate such as a glass epoxy substrate, a metal substrate, a polyester substrate, a polyimide substrate, a BT resin substrate, or a thermosetting polyphenylene ether substrate. Further, an article in which only a conductive wiring part is printed is referred to as a printed wiring board. Further, an article in which a conductor layer and a circuit pattern are formed by a printed wiring technique or the like on one surface or both surfaces of a laminate obtained by alternately laminating a circuit board and an insulating layer is referred to as a multilayer printed wiring board.

The circuit board in the present invention also includes an article in which a conductor layer and a circuit pattern are formed on one surface or both surfaces of a cured material formed by bonding adhesive films, followed by curing, that is, a cured material formed by bonding layers B of adhesive films (as a layer structure, a layer A, a layer B, a layer B, and a layer A are arranged in this order). Incidentally, from the viewpoint of adhesiveness, it is preferred that the surface on which a conductor layer and a circuit pattern are formed has been roughened in advance by a blackening treatment or the like.

<Layer A>

Thermosetting Resin (a1)

The layer A of the adhesive film for a multilayer printed wiring board of the present invention is provided for the purpose of improving the adhesion strength between an interlayer insulating layer and a conductor layer.

The thermosetting resin (a1) in the layer A is not particularly limited as long as it is thermally cured at a conventionally used thermal curing temperature ranging from 150 to 200° C. when forming an insulating layer of a multilayer printed wiring board. Examples of the thermosetting resin (a1) include thermosetting resins such as an epoxy resin having two or more epoxy groups per molecule, a polymer of a bismaleimide compound and a diamine compound, a cyanate ester compound, a bismaleimide compound, a bisallylnadide resin, and a benzoxazine compound. Among these thermosetting resins, an epoxy resin having two or more epoxy groups per molecule, a polymer of a bismaleimide compound and a diamine compound, and a cyanate ester compound are preferred. Further, an epoxy resin having two or more epoxy groups per molecule is preferred. An epoxy resin having two or more epoxy groups per molecule has excellent chemical resistance such as acid resistance and alkali resistance.

Examples of the epoxy resin having two or more epoxy groups per molecule include a bisphenol A-type epoxy resin, a bisphenol F-type epoxy resin, a bisphenol S-type epoxy resin, a biphenol-type epoxy resin, a naphthalene-type epoxy resin, a dicyclopentadiene-type epoxy resin, a phenol novolac-type epoxy resin, a cresol novolac-type epoxy resin, an aralkyl-type epoxy resin, and an aralkyl novolac-type epoxy resin.

Among the above-described epoxy resins, particularly, an aralkyl novolac-type epoxy resin having a biphenyl structure is preferred. The novolac-type epoxy resin having a biphenyl structure refers to an aralkyl novolac-type epoxy resin having an aromatic ring of a biphenyl derivative in the molecule, and examples thereof include an epoxy resin represented by the following formula (1). These epoxy resins may be used alone or two or more types thereof may be used in combination.

[Chem. 1]

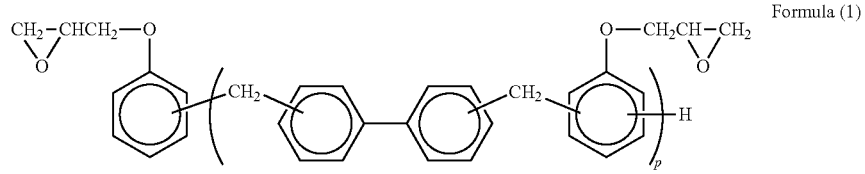

Formula (1)

(In the formula, p is an integer of 1 to 5)

Preferred specific examples of the thermosetting resin (a1) include the following marketed products: NC-3000 (an epoxy resin represented by the above formula (1) wherein the average value of p is 1.7) and NC-3000-H (an epoxy resin represented by the above formula (1) wherein the average value of p is 2.8) manufactured by Nippon Kayaku Co., Ltd.

In the case where an epoxy resin is used, an epoxy curing agent is needed. As the epoxy resin curing agent, various phenolic resins, acid anhydrides, amines, hydrazides, and the like can be used. As the phenolic resins, novolac-type phenolic resins, resol-type phenolic resins, and the like can be used. As the acid anhydrides, phthalic anhydride, benzophenonetetracarboxylic dianhydride, methylhimic acid, and the like can be used. As the amines, dicyandiamide, diaminodiphenylmethane, guanyl urea, and the like can be used. In order to improve the reliability of a multilayer printed wiring board, a novolac-type phenolic resin is preferred. Further, when a triazine ring-containing novolac-type phenolic resin or dicyandiamide is used, the peel-off strength of a metal foil or the peel-off strength of an electroless plating after a roughening treatment (chemical roughening) is improved, and therefore, such a compound is preferred.

Examples of the commercially available epoxy curing agent include dicyandiamide, phenol novolac, cresol novolac, a triazine-containing phenol novolac resin (for example, Phenolite LA-1356, manufactured by DIC Corporation, and Phenolite LA-7050 series, manufactured by DIC Corporation), and a triazine-containing cresol novolac resin (for example, Phenolite LA-3018, manufactured by DIC Corporation)

Further, in order to accelerate the reaction between the epoxy resin and the epoxy curing agent, a curing accelerator such as an imidazole, triphenylphosphine, phosphonium borate, or 3-(3,4-dichlorophenyl)-1,1-dimethylurea can also be used in combination therewith.

Other than the above-described epoxy resins, examples of the compound which can be used as the thermosetting resin (a1) in the present invention include a polymer of a bismaleimide compound and a diamine compound, and as the marketed product thereof, "Techmite E 2020" manufactured by Printec Corporation, and the like are exemplified.

Further, examples of the thermosetting resin (a1) include a cyanate ester compound, and as the marketed product thereof, Primaset BA200, Primaset BA230S, and Primaset LECY manufactured by Lonza Corporation, and Arocy L10 manufactured by Vantico AG, each of which is a bisphenol cyanate ester, are exemplified. Further, Primaset PT30 manufactured by Lonza Corporation and Arocy XU-371 manufactured by Vantico AG, each of which is a novolac-type cyanate ester, are exemplified. Further, Arocy XP71787.02L manufactured by Vantico AG, which is a dicyclopentadiene-type cyanate ester, and the like are exemplified.

Further, examples of the thermosetting resin (a1) include a bismaleimide compound, and as the marketed product thereof, BMI-S, which is 4 4'-diphenylmethane bismaleimide and is manufactured by Mitsui Chemicals, Inc., BMI-20, which is polyphenylmethane maleimide and is manufactured by Mitsui Chemicals, Inc., and the like are exemplified.

Further, examples of the thermosetting resin (a1) include a bisallylnadide resin, and as the marketed product thereof, BANI-M, which is diphenylmethane-4,4'-bisallylnadicimide and is manufactured by Maruzen Petrochemical Co., Ltd., and the like are exemplified.

Further, examples of the thermosetting resin (a1) include a benzoxazine compound, and as the marketed product thereof, B-a-type benzoxazine manufactured by Shikoku Chemicals Corporation, and the like are exemplified.

In the case where the adhesive film is prepared by molding the resin composition for an interlayer insulating layer, a liquid or a solid at room temperature, or a mixture thereof is used within a range capable of forming a film. Further, in the case where a thermosetting resin in a solid state is used as the thermosetting resin (a1), from the viewpoint that the layer B is laminated on a multilayer printed wiring board when forming an insulating layer, a resin having a property to melt at a temperature of 140° C. or lower is preferred.

Inorganic Filler (b1)

The inorganic filler (b1) contained in the layer A is important for preventing resin scattering when subjecting an interlayer insulating layer formed by thermally curing the adhesive film to a laser process and for enabling the adjustment of the laser-processed shape of the layer A and the layer B. Further, the inorganic filler (b1) is important for enabling the formation of a moderately roughened surface when roughening the surface of the interlayer insulating layer with an oxidizing agent and the formation of a conductor layer having an excellent adhesion strength by plating.

Examples of the inorganic filler (b1) include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, bismuth titanate, titanium oxide, barium zirconate, and calcium zirconate. Among these, particularly, silica is preferred.

As for the blending amount of the inorganic filler (b1) in the layer A, the mass ratio of the thermosetting resin (a1) to the inorganic filler (b1) contained in the layer A is within the range from 30:1 to 2:1. In the case where the blending amount of the inorganic filler (b1) is such that the mass ratio is less than 30:1, the laser processability is deteriorated so that resin scattering is sometimes observed after laser processing or the shape of a via sometimes becomes irregular. Further, in the case where the blending amount of the inorganic filler (b1) is such that the mass ratio exceeds 2:1, when forming a conductor layer by plating after roughening the surface of the interlayer insulating layer with an oxidizing agent, the adhesion strength between the interlayer insulating layer and the conductor layer may sometimes decrease.

The inorganic filler (b1) contained in the layer A and the below-described inorganic filler (b2) contained in the layer B do not necessarily have particularly a spherical shape. Therefore, it is necessary to define the specific surface area. In particular, the below-described fumed silica and colloidal silica do not have a spherical shape, and therefore, it is necessary to define the specific surface area.

The inorganic filler (b1) is preferably small from the viewpoint of forming a fine wiring on the interlayer insulating layer, and is required to have a specific surface area of 20 $m^2/g$ or more. If a filler having a small specific surface area is used, the surface profile after performing the roughening treatment with an oxidizing agent becomes large, and therefore, such a filler having a small specific surface area is not preferred.

As the method for measuring a specific surface area, for example, a method using a BET method in which the specific surface area of a sample is determined from an amount measured by adsorbing molecules whose adsorption occupied area has been known onto power particles is exemplified.

Further, in order to improve the moisture resistance, the inorganic filler (b1) is preferably an inorganic filler surface-treated with a surface treatment agent such as a silane coupling agent.

As the inorganic filler (b1) having a specific surface area as described above, for example, AEROSIL R972 (trade name), which is fumed silica manufactured by Japan Aerosil Co., Ltd. has a specific surface area of 110±20 $m^2/g$ (catalog value) and AEROSIL R202 manufactured by Japan Aerosil Co., Ltd. has a specific surface area of 100±20 $m^2/g$ (catalog value), and therefore, such silica is preferred.

Further, in the case of spherical silica manufactured by Admatechs Co., Ltd., for example, SO-C1 (trade name)

manufactured by Admatechs Co., Ltd. has a specific surface area of 17 m$^2$/g (catalog value) so that the surface profile after performing the roughening treatment with an oxidizing agent becomes large, and therefore, such silica is not preferred as the inorganic filler (b1) contained in the layer A.

Silica is most inexpensive as the inorganic filler (b1) contained in the layer A, and therefore is preferred, and examples of the preferred silica having a specific surface area of 20 m$^2$/g or more as described above include fumed silica. The fumed silica may be any, but is preferably fumed silica having high dispersibility in an epoxy resin in consideration of insulation reliability and heat resistance, and for example, AEROSIL R972 (trade name) manufactured by Japan Aerosil Co., Ltd., AEROSIL R202 manufactured by Japan Aerosil Co., Ltd., or the like subjected to a surface-hydrophobization treatment can be used.

Colloidal silica is easily formed into a substantially spherical shape from the viewpoint of the preparation process thereof. The particle diameter (specific surface area diameter) D of colloidal silica is approximately calculated according to the formula: D (nm)=2720/S from the specific surface area S (m$^2$/g) determined by a nitrogen adsorption method (BET method). When calculation is performed using this formula, for example, the primary particle diameter of PL-1 (trade name, manufactured by Fuso Chemical Co., Ltd., 181 m$^2$/g) is 15 nm, and the primary particle diameter of PL-7 (trade name, manufactured by Fuso Chemical Co., Ltd., 36 m$^2$/g) is 75 nm, and therefore, such silica can be preferably used as the colloidal silica.

By subjecting spherical silica which has a large specific surface area (a small average particle diameter), and has been difficult to use in the past from the viewpoint of storage stability (sedimentation or aggregation) to a special surface treatment, spherical silica can be used as the inorganic filler (b1) contained in the layer A. Examples of the silica filler subjected to a surface treatment so as to be uniformly dispersed in a solvent and/or an organic resin in this manner include "Admanano" (collective trade name, according to the catalog, there are products having an average particle diameter of 15 nm, 25 nm, and 50 nm) manufactured by Admatechs Co., Ltd., and such a filler dispersed in an organic resin or a solvent can be used in the present invention.

The above-described inorganic fillers may be used alone, or two or more types of the inorganic fillers may be used in combination.

Heat-Resistant Resin (c1)

The layer A can contain a heat-resistant resin (c1) which dissolves in an organic solvent. This heat-resistant resin (c1) is selected from a polyamide resin, a polyamideimide resin, a polyimide resin, a polyetherimide resin, a polybenzoxazole resin, and a polybenzimidazole resin, however, copolymers, etc. having a chemical structure of any of these resins are also included. Among these heat-resistant resins (c1), a polyamide resin, a polyamideimide resin, and a polyimide resin are preferred, and a polyamide resin is most preferred.

The heat-resistant resin (c1) may have a polybutadiene backbone, and also may contain a phenolic hydroxy group or an amide group which reacts with a thermosetting resin (for example, an epoxy group of an epoxy resin).

Further, the heat-resistant resins (c1) may be used alone, or two or more types thereof may be used in combination.

The heat-resistant resin (c1) contained in the layer A is required to have a property to dissolve in an organic solvent. A heat-resistant resin which cannot dissolve in a solvent does not mix with the other components so that a composition cannot be prepared, and therefore cannot be used in the present invention.

The organic solvent which dissolves the heat-resistant resin (c1) is not particularly limited, however, a solvent which is in a liquid state at room temperature ranging from 20 to 30° C. and has a property to dissolve the heat-resistant resin is used. Further, it is required that the organic solvent do not react with the heat-resistant resin or the thermosetting resin, and for example, cresol, etc. having a phenolic hydroxy group are excluded.

Preferred examples of the organic solvent include ketones such as acetone, methyl ethyl ketone, methyl isobutyl ketone, and cyclohexanone; acetate esters such as ethyl acetate, butyl acetate, cellosolve acetate, propylene glycol monomethyl ether acetate, and carbitol acetate; carbitols such as cellosolve, methyl carbitol, and butyl carbitol; aromatic hydrocarbons such as toluene and xylene; dimethylformamide, dimethylacetamide, N-methylpyrrolidone, diethylene glycol dimethyl ether, and propylene glycol monomethyl ether. Two or more types of these organic solvents may be used in combination.

The mass ratio of the thermosetting resin (a1) to the heat-resistant resin (c1) is set within the range from 20:1 to 3:1. By setting the mass ratio to 20:1 or less, the adhesion strength between the conductor layer and the interlayer insulating layer after performing the roughening treatment with an oxidizing agent can be ensured. Further, by setting the mass ratio to 3:1 or more, the size of surface irregularities after performing the roughening treatment step using an oxidizing agent is not increased so that a brittle layer is not formed, and the adhesion strength between the conductor layer and the interlayer insulating layer is not decreased, and therefore, such a mass ratio is preferred.

Specific examples of a preferred resin as the heat-resistant resin (c1) in the layer A among the commercially available heat-resistant resins include "BPAM-01" and "BPAM-155", each of which is a soluble polyamide manufactured by Nippon Kayaku Co., Ltd., "RIKACOAT SN20" and "RIKACOAT PN20", each of which is a soluble polyimide manufactured by New Japan Chemical Co., Ltd., "Ultem", which is a soluble polyetherimide manufactured by GE Plastics Japan Ltd., and "VYLOMAX HR11NN" and "VYLOMAX HR16NN", each of which is a soluble polyamideimide manufactured by Toyobo Co., Ltd.

Among these heat-resistant resins, "BPAM-01" and "BPAM-155" are preferred, and from the viewpoint of adhesiveness between the interlayer insulating layer obtained by curing the adhesive film and the conductor layer, and the surface irregularities when subjecting the interlayer insulating layer to the roughening treatment with an oxidizing agent, the most preferred results are obtained.

Crosslinked Organic Filler (d1)

The layer A can further contain a crosslinked organic filler (d1) having an average primary particle diameter of 1 µm or less. As the crosslinked organic filler (d1), for example, as an acrylonitrile-butadiene copolymer, a crosslinked NBR particle obtained by copolymerizing acrylonitrile and butadiene or a material obtained by copolymerizing acrylonitrile, butadiene, and a carboxylic acid such as acrylic acid is used, and also a so-called core-shell rubber particle, in which polybutadiene, NBR, or silicone rubber is used as a core and an acrylic acid derivative is used as a shell can be used. These materials may be used alone or two or more types thereof may be used in combination.

The above-described crosslinked NBR particle refers to a material obtained by copolymerizing acrylonitrile and butadiene, and partially crosslinking and granulating the copolymer during the copolymerization process. It is also possible to obtain a carboxylic acid-modified crosslinked NBR particle by performing copolymerization along with a carboxylic acid such as acrylic acid or methacrylic acid. Butadiene rubber-acrylic resin core-shell rubber particles can be obtained by a two-step polymerization process in which butadiene particles are polymerized by emulsion polymerization, and the polymerization is allowed to proceed continuously by adding a monomer such as an acrylate ester or acrylic acid. Crosslinked silicone rubber-acrylic resin core-shell rubber particles can be obtained by a two-step polymerization process in which silicone particles are polymerized by emulsion polymerization, and the polymerization is allowed to proceed continuously by adding a monomer such as an acrylate ester or acrylic acid. By these polymerization processes, the size of the particles can be set such that the average primary particle diameter is 50 nm to 1 μm.

The mass ratio of the thermosetting resin (a1) to the crosslinked organic filler (d1) is set within the range from 20:1 to 3:1. By setting the mass ratio to 20:1 or less, the adhesion strength between the conductor layer and the interlayer insulating layer can be improved. Further, by setting the mass ratio to 3:1 or more, the heat resistance is not deteriorated.

Examples of the crosslinked organic filler (d1) contained in the layer A include XER-91 manufactured by JSR Co., Ltd. as a commercially available product of the carboxylic acid-modified acrylonitrile-butadiene rubber particles, Paraloid EXL2655 manufactured by Rohm & Haas, Inc. and AC-3832 manufactured by GANTSU KASEI KK as the butadiene rubber-acrylic resin core-shell particles, and GENIOPERL P52 manufactured by Wacker Asahikasei Silicone Co., Ltd. as the crosslinked silicone rubber-acrylic resin core-shell rubber particles.

<Thickness of Layer A>

As described above, the layer A is provided for the purpose of improving the adhesion strength between the interlayer insulating layer and the conductor layer, however, if the film thickness is large, the thermal expansion coefficient may be increased. Therefore, the film thickness is preferably small. However, if the film thickness is too small, the resin layer may disappear due to the roughening treatment with an oxidizing agent, and as a result, the adhesion strength between the interlayer insulating layer and the conductor layer may be decreased. Accordingly the thickness of the layer A is preferably from 1 to 15 μm, more preferably from 1 to 10 μm further more preferably from 1 to 5 μm.

<Layer B>

The thermosetting resin composition layer (layer B) constituting the adhesive film of the present invention is a layer which plays a role in embedding the circuit board such that it is in direct contact with the circuit board when it is laminated, and then is melted to flow in the wiring pattern. Further, in the case where the circuit board has a though-hole or a via-hole, the layer B flows in the hole and plays a role in filling the hole.

Thermosetting Resin (a2)

Since the thermosetting resin (a2) contained in the thermosetting resin composition forming the layer B is used by forming a layer in the adhesive film, a material which is generally in a solid state at 40° C. or lower is used. Further, since the layer B is subjected to vacuum lamination at 140° C. or lower, the thermosetting resin (a2) is required to be melted at 40 to 140° C. From the viewpoint of energy saving for a vacuum laminator, and also from the viewpoint of mass production, the thermosetting resin (a2) preferably melts at 120° C. or lower, more preferably melts at 100° C. or lower. Therefore, in the case of performing vacuum lamination, it is preferred that the thermosetting resin (a2) melts at 60 to 140° C., more preferably at 70 to 120° C., and enables the lamination of the circuit board.

Examples of the thermosetting resin (a2) contained in the layer B include the same materials as the thermosetting resin (a1) contained in the layer A. In the case where an epoxy resin is used as the thermosetting resin, an epoxy curing agent is needed, and examples of the epoxy curing agent include the same materials as described with respect to the layer A. From the viewpoint of reliability in a reflow test or the like, the epoxy resin preferably has a glass transition temperature (Tg) of 150° C. or higher. From the same viewpoint, in the case of using an epoxy resin, it is preferred to use a multifunctional epoxy resin having more than two epoxy groups on average per molecule. Further, in the same manner as the layer A, a curing accelerator such as an imidazole, triphenylphosphine, phosphonium borate, or 3-(3,4-dichlorophenyl)-1,1-dimethylurea may be used in combination therewith.

The thermosetting resin composition constituting the layer B is required to embed the circuit board, and therefore, the lamination temperature is preferably determined according to the melt viscosity characteristic of the resin composition as disclosed in WO 01/97582. That is, the melt viscosity characteristic can be determined as follows using a temperature-melt viscosity curve obtained by measuring a dynamic viscoelastic modulus. In the case where the measurement is performed at a temperature rise rate of 5° C./min by setting the measurement starting temperature to 40° C., the lamination is performed preferably in a temperature range in which the melt viscosity is less than 1000 Pa·s, more preferably in a temperature range in which the melt viscosity is less than 500 Ps·s from the viewpoint of circuit embeddability.

It is preferred to prepare the layer B such that the layer B contains a resin having a softening point lower than the actual lamination temperature determined by the above-described melt viscosity characteristic in an amount of 5% by mass or more, more preferably 10% by mass or more. By setting the amount of the resin to 5% by mass or more, when the layer B is melted during lamination, a melt viscosity sufficient for filling the resin between the circuits, and in the via-hole, the through-hole, etc. without forming voids can be obtained.

Inorganic Filler (b2)

To the layer B, further a filler may be added. As the inorganic filler (b2) added to the layer B, the same material as the inorganic filler (b1) in the layer A can be used. However, as the particle diameter decreases, the melt viscosity increases, and therefore, it is preferred to use one type of inorganic filler having an average particle diameter of 0.01 to 2.0 μm or two or more types thereof in admixture.

The addition amount of the inorganic filler (b2) when it is added greatly varies depending on the characteristics or required function of the interlayer insulating layer formed by curing the adhesive film of the present invention. However, since a material having a low thermal expansion coefficient is needed, it is preferred to blend the inorganic filler (b2) in an amount of 10 to 85% by mass, more preferably 30 to 85% by mass in the layer B.

The inorganic filler (b2) does not necessarily have particularly a spherical shape, but preferably has a spherical shape so that the viscosity when it is melted is decreased to improve the circuit embeddability.

The inorganic filler (b2) in the layer B preferably contains spherical silica having an average particle diameter of 1 μm or less in an amount of 50% by mass or more in the total inorganic filler (b2) in the layer B.

In the case where an organic filler is added to the layer B, the same material as the crosslinked organic filler (d1) in the layer A can be used.

The thickness of the layer B is preferably adjusted so that the total thickness of the layer A and the layer B is a desired thickness. Since the thickness of the conductor layer having the circuit board is generally within the range from 5 to 70 μm, the thickness of the layer B is preferably set within the range from 10 to 100 μm.

In the layer A and the layer B, further a flame retardant may be blended. As the flame retardant, an inorganic flame retardant or a resin flame retardant is used. Examples of the inorganic flame retardant include aluminum hydroxide and magnesium hydroxide. Examples of the resin flame retardant include a halogen-based flame retardant and a non-halogen-based flame retardant, however, from an environmental viewpoint, a non-halogen-based flame retardant is preferred.

Examples of the resin flame retardant include a resin flame retardant to be blended as a filler and a resin flame retardant having a functional group which reacts with the thermosetting resin composition. Examples of the resin flame retardant to be blended as a filler include PX-200 (trade name) which is an aromatic phosphate ester-based flame retardant and is manufactured by Daihachi Kagaku Kogyo KK and Exolit OP 930 (trade name) which is a polyphosphate compound and is manufactured by Clariant Japan Co., Ltd. Examples of the resin flame retardant having a functional group which reacts with the thermosetting resin composition include an epoxy-based phosphorus-containing flame retardant and a phenolic phosphorus-containing flame retardant. Examples of the epoxy-based phosphorus-containing flame retardant include FX-305 (trade name) manufactured by Tohto Kasei Co., Ltd. Examples of the phenolic phosphorus-containing flame retardant include HCA-HQ (trade name) manufactured by SANKO Company Limited and XZ92741 (trade name) manufactured by The Dow Chemical Company.

These flame retardants may be used alone or two or more types thereof may be used in combination.

<Layer C>

The layer C in the adhesive film of the present invention constitutes a support which supports the layer A. In the step of manufacturing a multilayer printed wiring board, after the adhesive film is laminated on the circuit board, the layer C is peeled off or removed from the layer A. Examples of the support include polyolefins such as polyethylene and polyvinyl chloride; polyesters such as polyethylene terephthalate and polyethylenenaphthalate; polycarbonates, polyimides, and further, release papers and metal foils such as a copper foil and an aluminum foil.

In the case where a copper foil is used as the support, the copper foil can also be used as the conductor layer. Examples of the copper foil include a rolled copper foil and an electrolytic copper foil. The thickness of the copper foil is preferably from 2 to 36 μm. When a copper foil with a carrier is used, the workability when manufacturing the multilayer printed wiring board can be improved.

The support may be subjected to a matte treatment, a corona treatment, a release treatment, or the like. The thickness of the support is preferably from 10 to 150 μm, more preferably from 25 to 50 μm. If the thickness of the layer C is from 10 to 150 μm, the handleability is favorable. The layer C is eventually peeled off or removed. Therefore, it is not preferred that the thickness exceeds 150 μm from the viewpoint of wasting resources.

<Protective Film>

In the adhesive film of the present invention, the surface of the layer B on the opposite side to the surface on which the layer A is placed may be covered with a protective film. By providing the protective film, adhesion of foreign substances to the layer B or damage to the layer B can be prevented.

The protective film is peeled off from the layer B before laminating the adhesive film on the circuit board or before performing a thermal curing treatment. The above-described material which can be used as the support (layer C) can also be used as the protective film. The thickness of the protective film is not particularly limited, but is preferably in the range from 1 to 40 μm.

<Method for Preparing Adhesive Film>

The adhesive film of the present invention can be prepared according to a method known to those skilled in the art. As the method for preparing the adhesive film by sequentially arranging the layer C, the layer A, and the layer B of the adhesive film of the present invention in this order, two preparation methods can be exemplified.

A first method is a method in which the layer A is formed on the layer C, and further the layer B is formed on the layer A. For example, the components (a), (b), and (d) are dissolved in an organic solvent, and further the component (c) and the like are mixed therein, whereby a varnish for forming the layer A is prepared. Further, a varnish for forming the layer B is prepared.

To the layer C serving as the support, the varnish for forming the layer A is applied, and the organic solvent is dried by heating or blowing hot air, whereby the layer A can be formed on the layer C. Further, the varnish for forming the layer B is applied onto the layer A after drying, whereby the adhesive film can be prepared.

The drying condition for the organic solvent is not particularly limited, however, the drying is performed so that the content ratio of the organic solvent in the resin composition formed after drying is 10% by mass or less, preferably 5% by mass or less. The drying condition affects the temperature-melt viscosity curve of the layer B, and therefore is preferably set so that the temperature-melt viscosity curve of the layer B is satisfied. As one example of the drying condition, the varnish containing the organic solvent in an amount of 30 to 80% by mass is dried at 50 to 150° C. for about 3 to 10 minutes.

A second method is a method in which a film composed of the layer C and the layer A and a film composed of the layer B and the layer C are laminated on each other. In this method, the varnish for forming the layer B is applied onto the layer C serving as the support, whereby a film composed of the layer C and the layer B is formed. Further, according to the first method, a film composed of the layer C and the layer A is formed. Subsequently, the film composed of the layer C and the layer B and the film composed of the layer C and the layer A are laminated on each other. In this case, the adhesive film has a layer structure in which the layer C, the layer A, the layer B, and the layer C are arranged in this order, and the layer C joined to the layer B can function as a protective film. Incidentally, in the adhesion film of the present invention, the layer A and the layer B may be semi-cured in advance.

As the application device which applies the varnish for forming the layer A of the adhesive film of the present invention to the layer C, an application device known to those skilled in the art such as a comma coater, a bar coater, a kiss coater, a roll coater, a gravure coater, or a die coater can be used. These devices can be appropriately selected according to the thickness of the layer A. These application devices can also be used when the layer B is applied onto the layer A.

The areas of the layer A and the layer B are preferably smaller than the area of the layer C serving as the support. In the case where the layer C serving as the support is formed in a strip shape, it is preferred to apply the varnish for forming the layer A such that the width of the layer A is smaller than the width of the continuous body of the layer C. The adhesive film formed in a strip shape can be wound into a roll and stored.

Examples of the organic solvent for preparing the varnish include ketones such as acetone, methyl ethyl ketone, methyl isobutyl ketone, and cyclohexanone; acetate esters such as ethyl acetate, butyl acetate, cellosolve acetate, propylene glycol monomethyl ether acetate, and carbitol acetate; carbitols such as cellosolve, methyl carbitol, and butyl carbitol; aromatic hydrocarbons such as toluene and xylene; dimethylformamide, dimethylacetamide, N-methylpyrrolidone, diethylene glycol dimethyl ether, and propylene glycol monomethyl ether. Two or more types of these organic solvents may be used in combination.

The drying condition is not particularly limited, however, the drying is performed so that the content ratio of the organic solvent in the resin composition is generally 10% by mass or less, preferably 5% by mass or less. The drying condition also affects the temperature-melt viscosity curve of the layer B, and therefore is preferably set so that the above-described temperature-melt viscosity curve of the layer B is satisfied.

Although the condition varies depending on the amount of the organic solvent in the varnish, for example, the varnish containing the organic solvent in an amount of 30 to 80% by mass can be dried at 50 to 150° C. for about 3 to 10 minutes. A preferred drying condition can be appropriately set by those skilled in the art or by a simple experiment.

As described above, it is preferred that the thickness of the layer A is from 1 to 15 and the thickness of the layer B is from 10 to 100 Further, the adhesive film can be wound into a roll and stored and preserved.

[Second Embodiment of Adhesive Film]

An adhesive film according to a second embodiment of the present invention is used for a multilayer printed wiring board of a build-up system, and can form a conductor layer having a high adhesion strength on a smooth interlayer insulating layer.

The circuit board in the present invention refers mainly to an article in which a conductor layer and a circuit pattern are formed by a printed wiring technique or the like on one surface or both surfaces of a substrate such as a glass epoxy substrate, a metal substrate, a polyester substrate, a polyimide substrate, a BT resin substrate, or a thermosetting polyphenylene ether substrate. Further, an article in which only a conductive wiring part is printed is referred to as a printed wiring board. Further, an article in which a conductor layer and a circuit pattern are formed by a printed wiring technique or the like on one surface or both surfaces of a laminate obtained by alternately laminating a circuit board and an insulating layer is referred to as a multilayer printed wiring board.

Further, in the present invention, the term "smooth" or "substantially smooth" means that the surface roughness Ra is less than 0.3 μm.

Hereinafter, the adhesive film of the present invention will be described in detail. The adhesive film of the present invention is configured such that a layer A containing a resin composition obtained by blending the following components (a) to (d) in blending amounts described below, a layer B containing a thermosetting resin composition which is in a solid state at a temperature lower than 40° C. but melts at a temperature of 40° C. or higher but lower than 140° C., and a layer C serving as a support which supports the layer A are arranged in the order of the layer C, the layer A, and the layer B.

The components (a) to (d) constituting the resin composition contained in the layer A are as follows:

(a) at least one resin which dissolves in an organic solvent and is selected from a polyimide resin, a polyamideimide resin, a polyamide resin, a polyetherimide resin, and a polybenzoxazole resin;

(b) a thermosetting resin;

(c) a filler; and (d) a resin having a polysiloxane backbone.

Further, the blending amounts of the components (a) to (d) are as follows.

The ratio of the mass of the component (a) to the mass of the component (b) is from 1:2 to 1:20, the ratio of the total mass of the components (a) and (b) to the mass of the component (c) is from 20:1 to 2:1, the ratio of the mass of the component (d) to the mass of the component (a) is from 1:1000 to 2:5, and the total blending amount of the components (a) to (d) with respect to 100 parts by mass of the resin composition is 70 parts by mass or more.

In the adhesive film of the present invention, the thickness of the layer A is preferably in the range from to 15 μm. Further, the thickness of the layer B can be determined according to the thickness of the conductor layer formed on the printed wiring board. In the case where the thickness of the conductor layer is from 5 to 70 μm, the thickness of the layer B is preferably in the range from 10 to 100 μm. Further, the thickness of the layer C is preferably in the range from 10 to 150 μm.

<Layer A>

The layer A constitutes an interlayer insulating layer which insulates multilayered circuit patterns in the multilayer printed wiring board multilayered by a build-up process.

Component (a)

The component (a) is a heat-resistant resin which dissolves in an organic solvent and is selected from a polyimide resin, a polyamideimide resin, a polyamide resin, a polyetherimide resin, a polybenzoxazole resin, and a polybenzimidazole resin. Further, copolymers, etc. having a chemical structure of any of these resins are also included in these heat-resistant resins. Among these heat-resistant resins, at least one resin selected from a polyimide resin, a polyamideimide resin, and a polyamide resin is preferred, and a polyamide resin is more preferred.

The heat-resistant resin which can be used as the component (a) in the present invention is required to have a property to dissolve in an organic solvent. A heat-resistant resin which cannot dissolve in a solvent does not mix with the other components so that a composition cannot be prepared, and therefore cannot be used in the present invention.

The organic solvent is not particularly limited, however, in the present invention, a solvent which is in a liquid state at room temperature ranging from 20 to 30° C. and has a property to dissolve the heat-resistant resin can be used. Further, it is required that the organic solvent do not react with the heat-resistant resin or the thermosetting resin, and for example, cresol, etc. having a phenolic hydroxy group are excluded.

Preferred examples of the organic solvent which can be used in the present invention include ketones such as acetone, methyl ethyl ketone, methyl isobutyl ketone, and cyclohexanone; acetate esters such as ethyl acetate, butyl acetate, cellosolve acetate, propylene glycol monomethyl ether acetate, and carbitol acetate; carbitols such as cellosolve, methyl carbitol, and butyl carbitol; aromatic hydrocarbons such as toluene and xylene; dimethylformamide, dimethylacetamide, N-methylpyrrolidone, diethylene glycol dimethyl ether, and propylene glycol monomethyl ether. Two or more types of these organic solvents may be used in combination.

As the heat-resistant resin which can be used as the component (a), a heat-resistant resin having a rupture elongation of 10% or more, an elastic modulus at 50° C. of 1 GPa or less, and a glass transition temperature of 160° C. or higher is preferred. The rupture elongation is determined according to the method described in JIS K7127. Incidentally, in the present invention, the case where "the glass transition temperature is 160° C. or higher" also includes a case where the glass transition temperature is higher than a decomposition temperature, and therefore, practically the glass transition temperature cannot be observed. Further, the decomposition temperature refers to a temperature at which the amount of mass reduction as measured according to the method described in JIS K7120 decreases to 5%.

The heat-resistant resin which can be used as the component (a) may have a polybutadiene backbone, and also may have a phenolic hydroxy group or an amide group which reacts with a thermosetting resin (for example, an epoxy group of an epoxy resin).

The above-described heat-resistant resins may be used alone, or two or more types thereof may be used in combination.

As specific examples of the heat-resistant resin which can be used as the component (a), the marketed products described below can be used. For example, "BPAM-01" and "BPAM-155", each of which is a soluble polyamide manufactured by Nippon Kayaku Co., Ltd., "RIKACOAT SN20" and "RIKACOAT PN20", each of which is a soluble polyimide manufactured by New Japan Chemical Co., Ltd., "Ultem", which is a soluble polyetherimide manufactured by GE Plastics Japan Ltd., and "VYLOMAX HR11NN" and "VYLOMAX HR16NN", each of which is a soluble polyamideimide manufactured by Toyobo Co., Ltd can be exemplified.

Among the above-described heat-resistant resins, "BPAM-01" and "BPAM-155" having a polybutadiene backbone have a sufficient peel-off strength of a metal foil, and a high peel-off strength of an electroless plating after a roughening treatment (chemical treatment), and therefore are preferred.

Component (b)

As the component (b), the thermosetting resin (a1) in the first embodiment can be applied.

Component (c)

The filler serving as the component (c) can be classified into an inorganic filler and an organic filler. With the object of forming a fine printed wiring on the adhesive film, the particle diameter of the filler is preferably small. Specifically, the average particle diameter of the filler is preferably 1 μm or less, more preferably 0.5 μm or less, further more preferably from 0.01 to 0.1 μm.

By incorporating the component (c) in the adhesive film, in the step of manufacturing a multilayer printed wiring board, the scattering of residues (smears) of the adhesive film generated when the laser process is performed after thermally curing the adhesive film can be prevented and also the accuracy of the shape of the via-hole formed by the laser process can be increased. Further, by incorporating the component (c) in the adhesive film, in the below-described roughening/desmear treatment, the progression of roughening of the surface of the insulating layer of the adhesive film can be suppressed. Further, when an inorganic filler is used as the component (c), the thermal expansion coefficient of the adhesive film can be decreased, and when an organic filler is used, the stress in the cured material can be relaxed.

Examples of the inorganic filler include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, bismuth titanate, titanium oxide, barium zirconate, and calcium zirconate. Among these, particularly, silica is preferred.

In order to improve the moisture resistance of the adhesive film, it is preferred that the surface of the inorganic filler is treated with a surface treatment agent such as a silane coupling agent.

Examples of the silica having an average particle diameter of 0.1 μm or less among the inorganic fillers which can be used as the component (c) include fumed silica. From the viewpoint of insulation reliability and heat resistance, fumed silica having high dispersibility in an epoxy resin is preferred. As a marketed product of the fumed silica, for example, AEROSIL R972 and AEROSIL R202 manufactured by Japan Aerosil Co., Ltd., and the like can be used. Both products have been subjected to a surface-hydrophobization treatment so that the dispersibility in an epoxy resin has been increased, and therefore, such products are preferred.

Examples of the organic filler include core-shell rubber particles, acrylic rubber particles, and silicone particles.

The above-described inorganic fillers and organic fillers may be used alone, or two or more types thereof may be used in combination.

Component (d)

The component (d) is a resin having a polysiloxane backbone. By incorporating the component (d) in the adhesive film, it becomes easy to uniformly apply the layer A onto the layer C.

Examples of the resin having a polysiloxane backbone include a polyether-modified polydimethylsiloxane, a polyester-modified polydimethylsiloxane, a polyester-modified methylalkylpolysiloxane, a polyether-modified polymethylalkylsiloxane, an aralkyl-modified polymethylalkylsiloxane, and a polyether-modified polymethylalkylsiloxane.

As specific examples of the resin having a polysiloxane backbone which can be used as the component (d), marketed products described below can be used. For example, BYK-310, BYK-313, BYK-300, BYK-320, and BYK-330 manufactured by Big Chemie Japan Co., Ltd., etc. are exemplified.

The above-described resins having a polysiloxane backbone may be used alone, or two or more types thereof may be used in combination.

Other Components

In the adhesive film of the present invention, the layer A may contain a component other than the components (a) to (d). Examples of the other component blended in the layer A include additives such as a thickener such as orben or benton; an adhesiveness imparting agent such as an imidazole-based, a thiazole-based, a triazole-based, or a silane coupling agent; and a colorant such as phthalocyanine blue, phthalocyanine green, iodine green, disazo yellow, or carbon black.

In the layer A, a flame retardant may be blended. Examples of the flame retardant include an inorganic flame retardant and a resin flame retardant.

Examples of the inorganic flame retardant include aluminum hydroxide and magnesium hydroxide exemplified as the filler which can be used as the component (c). The resin flame retardant may be a halogen-based resin or a non-halogen-based resin, however, in view of an environmental load, a non-halogen-based resin is preferably used.

Examples of the resin flame retardant include a resin flame retardant to be blended as a filler and a resin flame retardant having a functional group which reacts with the thermosetting resin composition. Examples of the marketed product of the former flame retardant include PX-200 which is an aromatic phosphate ester-based flame retardant and is manufactured by Daihachi Kagaku Kogyo KK and Exolit OP 930 which is a polyphosphate compound and is manufactured by Clariant Japan Co., Ltd.

Further, examples of the flame retardant having a functional group which reacts with the thermosetting resin composition include an epoxy-based phosphorus-containing flame retardant and a phenolic phosphorus-containing flame retardant. Examples of the epoxy-based phosphorus-containing flame retardant include FX-305 manufactured by Tohto Kasei Co., Ltd. Examples of the phenolic phosphorus-containing flame retardant include HCA-HQ manufactured by SANKO Company Limited and XZ92741 manufactured by The Dow Chemical Company.

Only one type of the above-described flame retardants may be used, or two or more types thereof may be used in combination.

<Blending Ratio of Each Component in Layer A>

The ratio of the component (a) in the total solid content forming the layer A is preferably from 3 to 25% by mass, more preferably from 5 to 20% by mass, further more preferably from 5 to 18% by mass of the solid content excluding the filler serving as the component (c). If the ratio of the component (a) in the total solid content forming the layer A is from 3 to 25% by mass of the solid content excluding the filler, the adhesion strength between the interlayer insulating layer subjected to a roughening/desmear treatment and the conductor layer can be sufficiently ensured.

On the other hand, if the ratio of the component (a) in the total solid content forming the layer A exceeds 25% by mass, the chemical resistance when performing the roughening/desmear treatment is deteriorated. Due to this, it is necessary to set a milder roughening treatment than a treatment of removing a smear in the via-hole, so that the adjustment of the condition for the preparation process is complicated, and therefore, such a ratio is not preferred. Further, if the ratio of the component (a) exceeds 25% by mass, a brittle layer is liable to be formed on the layer A by the roughening/desmear treatment, or the layer A itself is removed so that the thickness of the layer A cannot be ensured, and therefore, such a ratio is not preferred.

In the layer A in the adhesive film, of the present invention, the ratio of the mass of the heat-resistant resin used as the component (a) to the mass of the thermosetting resin used as the component (b) is preferably from 1:2 to 1:20, more preferably from 1:3 to 1:10.

The heat-resistant resin used as the component (a) is inferior in resistance to an alkaline permanganic acid solution used in the desmear treatment to the thermosetting resin used as the component (b). Due to this, the mass ratio of the component (a) is set to be smaller than the mass ratio of the component (b). That is, by setting the ratio of the mass of the component (a) to the mass of the component (b) to 1:2 to 1:20, the adhesion strength between the adhesive film and the conductor layer can be increased while keeping the surface of the adhesive film substantially smooth.

The blending amount of the filler used as the component (c) is preferably within the range from 3 to 35% by mass with respect to the mass of the adhesive film. If the blending amount of the filler is from 3 to 35% by mass, the scattering of smears can be suppressed, and also the accuracy of the shape of the via-hole can be kept within an acceptable range. Further, if the blending amount of the filler is from 3 to 35% by mass, the adhesion strength between the adhesive film and the conductor layer can be increased.

In the layer A in the adhesive film of the present invention, the ratio of the total mass of the components (a) and (b) to the mass of the component (c) is required to be from 20:1 to 2:1, more preferably from 20:1 to 4:1. If the ratio of the filler used as the component (c) is within this range, the adhesion strength between the adhesive film and the conductor layer can be increased.

Further, in the layer A in the adhesive film of the present invention, the ratio of the mass of the component (d) to the mass of the component (a) is required to be from 1:1000 to 2:5, more preferably from 1:100 to 1:5. If the ratio of the resin having a polysiloxane backbone used as the component (d) is within this range, the adhesion strength between the adhesive film and the conductor layer can be increased. If the ratio of the resin having a polysiloxane backbone used as the component (d) is lower than this range, when the varnish prepared for forming the layer A is applied onto the support which is the layer C, it is difficult to achieve uniform application, and thus, crawling or a pin hole is easily caused, and therefore, such a ratio is not preferred.

Further, in the layer A in the adhesive film of the present invention, a component other than the resin composition containing the components (a) to (d) may be contained. In the case where a component other than the resin composition containing the components (a) to (d) is contained, the total blending amount of the components (a) to (d) with respect to 100 parts by mass of the resin composition containing the components (a) to (d) is required to be 70 parts by mass or more. The blending amount of the resin composition containing the components (a) to (d) is more preferably 75% by mass or more, further more preferably 80% by mass or more.

If the blending amount of the resin composition containing the components (a) to (d) in the resin composition constituting the layer A is less than 70% by mass, the effect of the present application such that the adhesion strength between the adhesive film and the conductor layer is increased while making the surface roughness of the interlayer insulating layer of the adhesive film smooth is not sufficiently obtained, and therefore, such a blending amount is not preferred.

<Layer B>

When the adhesive film is laminated on a circuit board having a printed wiring formed thereon in a multilayer printed wiring board having a multilayer circuit board, the layer B of the adhesive film of the present invention comes in contact with the circuit board and is melted during thermal curing to flow in the wiring pattern of the circuit board.

Further, the layer B flows in a via-hole formed in the circuit board and is filled in the via-hole.

In the step of manufacturing a multilayer printed wiring board formed by a build-up process, in consideration of the curing temperature at which the adhesive film of the present invention is cured, the layer B is preferably a thermosetting resin composition having a property such that it is in a solid state at a temperature lower than 40° C. and melts at a temperature of 40° C. or higher but lower than 140° C.

Since in the layer B, a printed wiring and a circuit pattern formed on the surface of the circuit board are embedded, the temperature condition in the lamination step (referred to as lamination temperature) is preferably determined according to the melt viscosity characteristic of the resin composition (disclosed in WO 01/97582). The melt viscosity characteristic can be determined using a temperature-melt viscosity curve obtained by measuring a dynamic viscoelastic modulus.

In the case where the measurement is performed at a temperature rise rate of 5° C./min by setting the measurement starting temperature to 40° C., the lamination is performed preferably in a temperature range in which the dynamic viscoelasticity is lower than 1000 Pa·s, more preferably in a temperature range in which the dynamic viscoelasticity is lower than 500 Ps·s.

The lamination temperature using a vacuum laminator is preferably from 60 to 140° C., more preferably from 70 to 120° C. Further, the melting temperature of the layer B is preferably 120° C. or lower, more preferably 100° C. or lower.

Further, it is preferred that in the layer B, a resin having a softening point lower than the lamination temperature determined by the above-described melt viscosity characteristic is contained in an amount of 5% by mass or more, more preferably 10% by mass or more. If the blending amount of the resin having a softening point lower than the lamination temperature is less than 5%, when the layer B is melted in the lamination step, it is sometimes difficult to obtain a melt viscosity capable of filling the melted layer B between the circuits, and in the via-hole, the through-hole, etc. without forming voids.

The thermosetting resin composition forming the layer B contains a thermosetting resin. Examples of the thermosetting resin include the same materials as the thermosetting resin of the component (b) contained in the resin composition constituting the layer A. In the case where an epoxy resin is used as the thermosetting resin, an epoxy curing agent is needed. As the epoxy curing agent, the above-described material can be applied. Further, as described above, a curing accelerator such as an imidazole, triphenylphosphine, phosphonium borate, or 3-(3,4-dichlorophenyl)-1,1-dimethylurea can also be used in combination therewith.

To the thermosetting resin composition forming the layer B, a filler may be added. The addition amount of the filler can be appropriately adjusted according to the characteristics of the insulating layer formed by curing the adhesive film of the present invention and the function of the adhesive film. The addition amount of the filler is preferably from 10 to 85% by mass, more preferably from 30 to 85% by mass. The above-described fillers exemplified as the component (c) can be used as the filler added to the layer B. It is preferred to use one type of inorganic filler or organic filler exemplified as the component (c) or two or more types thereof in admixture.

As the average particle diameter of the filler added to the layer B decreases, the melt viscosity of the layer B increases. Therefore, the average particle diameter of the filler is preferably set to 0.01 to 2.0 μm. By setting the average particle diameter of the filler added to the layer B within this range, the melted layer B can be filled between the circuits, and in the via-hole, the through-hole, etc. without forming voids.

Also in the layer B, a flame retardant may be blended. The above-described flame retardants which can be blended in the layer A can also be blended in the layer B.

<Layer C>

The layer C of the first embodiment can be applied.

<Protective Film>

In the same manner as in the first embodiment, a protective film can be provided on the surface of the layer B on the opposite side to the surface on which the layer A of the adhesive film of the present invention is placed.

<Method for Preparing Adhesive Film>

The adhesive film can be prepared in the same manner as in the first embodiment.

[Third Embodiment of Adhesive Film]

An adhesive film of the present invention is used for a multilayer printed wiring board of a build-up system, and can form a conductor layer having a high adhesion strength even on an interlayer insulating layer having a smooth surface-roughened state.

The circuit board in the present invention refers mainly to an article in which a conductor layer and a circuit pattern are formed by a printed wiring technique or the like on one surface or both surfaces of a substrate such as a glass epoxy substrate, a metal substrate, a polyester substrate, a polyimide substrate, a BT resin substrate, or a thermosetting polyphenylene ether substrate. Further, an article in which only a conductive wiring part is printed is referred to as a printed wiring board. Further, an article in which a conductor layer and a circuit pattern are formed by a printed wiring technique or the like on one surface or both surfaces of a laminate obtained by alternately laminating a circuit board and an insulating layer is referred to as a multilayer printed wiring board.

Further, in the present invention, the term "smooth" or "substantially smooth" means that the surface roughness Ra is less than 0.4 μm.

Hereinafter, the adhesive film of the present invention will be described in detail. The adhesive film of the present invention is configured such that a layer A containing a resin composition obtained by blending the following components (a), (b), (c), and (e) in blending amounts described below, a layer B containing a thermosetting resin composition which is in a solid state at a temperature lower than 40° C. but melts at a temperature of 40° C. or higher but lower than 140° C., and a layer C serving as a support which supports the layer A are arranged in the order of the layer C, the layer A, and the layer B.

The components (a), (b), (c), and (e) constituting the resin composition contained in the layer A are as follows:

(a) at least one resin which dissolves in an organic solvent and is selected from a polyimide resin, a polyamideimide resin, a polyamide resin, a polyetherimide resin, and a polybenzoxazole resin;
(b) a thermosetting resin;
(c) a filler; and
(e) a phenoxy resin.

Further, the respective blending amounts of the components (a), (b), (c), and (e) are as follows.

The ratio of the mass of the component (a) to the mass of the component (b) is from 1:0.5 to 1:50, the ratio of the total mass of the components (a) and (b) to the mass of the component (c) is from 1:0.02 to 1:0.5, the ratio of the mass of the component (e) to the mass of the component (a) is from 1:0.2 to 1:10, and the total blending amount of the components (a), (b), (c), and (e) with respect to 100 parts by mass of the resin composition is 70 parts by mass or more.

In the adhesive film of the present invention, the thickness of the layer A is preferably in the range from 1 to 15 μm. Further, the thickness of the layer B can be determined according to the thickness of the conductor layer formed on the printed wiring board. In the case where the thickness of the conductor layer is from 5 to 70 μm, the thickness of the layer B is preferably in the range from 10 to 100 μm. Further, the thickness of the layer C is preferably in the range from 10 to 150 μm.

<Layer A>

In the third embodiment, as the components (a), (b), and (c) and other components constituting the layer A, the same materials as described in the second embodiment can be applied.

The component (e) is a phenoxy resin. By blending a phenoxy resin in the layer A, the joining strength between the insulating layer formed by curing the layer A and the layer B and the conductor layer can be improved, and also the blister defects of the conductor layer can be suppressed. Further, the joining strength between the insulating layer and a solder resist can be improved.

The weight average molecular weight of the phenoxy resin is preferably from 5000 to 100000. If the weight average molecular weight of the phenoxy resin is from 5000 to 100000, the flexibility and the mechanical strength of the adhesive film formed by including the component (e) can be improved, and also the handleability of the adhesive film can be facilitated. Further, for example, resistance to a chemical used in the desmear treatment can be improved. In addition, if the weight average molecular weight of the phenoxy resin is from 5000 to 100000, an effect of improving the bonding strength between the adhesive film formed by including the component (e) and the conductor layer can be further enhanced. Further, an effect of suppressing the occurrence of blisters in the conductor layer joined to the adhesive film can be further more enhanced.

If the weight average molecular weight of the phenoxy resin exceeds 100000, the compatibility of the phenoxy resin with the other components forming the layer A or the solubility of the phenoxy resin in the organic resin is significantly deteriorated, and therefore, such a weight average molecular weight is not preferred.

In the present invention, the component (e) is preferably a phenoxy resin having a fluorene backbone. By using a phenoxy resin having a fluorene backbone as the component (e), the chemical resistance of the layer A can be improved. Further, in the roughening/desmear treatment or the like, it becomes easy to impart appropriate irregularities to the insulating layer with an oxidizing agent.

Examples of the marketed product of the phenoxy resin include YP-50, FX-273, FX-280, and FX-293 (manufactured by Nippon Steel Chemical Co., Ltd.), and also include E-1256, YX-8100, YL-6742, YL-6835, YL-6953, YL-6954, and YL-6974 (manufactured by Mitsubishi Chemical Co., Ltd.). Among these, it is preferred to use FX-273 and FX-293 (manufactured by Nippon Steel Chemical Co., Ltd.) as the phenoxy resin having a fluorene backbone.

These phenoxy resins may be used alone, or two or more types thereof may be used in combination.

<Blending Ratio of Each Component in Layer A>

The ratio of the component (a) in the total solid content forming the layer A is preferably from 3 to 25% by mass, more preferably from 5 to 20% by mass, further more preferably from 5 to 18% by mass of the solid content excluding the filler serving as the component (c). If the ratio of the component (a) in the total solid content forming the layer A is from 3 to 25% by mass of the solid content excluding the filler, the joining strength between the adhesive film subjected to a roughening/desmear treatment and the conductor layer can be sufficiently ensured.

On the other hand, if the ratio of the component (a) in the total solid content forming the layer A exceeds 25% by mass, the chemical resistance when performing the roughening treatment is deteriorated. Due to this, it is necessary to set a milder roughening treatment than a treatment of removing a smear in the via-hole, so that the adjustment of the condition for the preparation process is complicated, and therefore, such a ratio is not preferred. Further, if the ratio of the component (a) exceeds 25% by mass, a brittle layer is liable to be formed on the layer A by the roughening/desmear treatment, or the layer A itself is removed so that the thickness of the layer A cannot be ensured, and therefore, such a ratio is not preferred.

Further, as for the blending amount of the component (b) in the total solid content forming the layer A, the ratio of the mass of the component (a) to the mass of the component (b) is preferably from 1:0.5 to 1:50, more preferably from 1:1 to 1:20, further more preferably from 1:2 to 1:20. The blending amount of the component (b) to the component (a) is important for determining the surface profile of the adhesive film after performing the below-described desmear treatment. By allowing the blending amounts of the components (a) and (b) to satisfy the above-described ratio, the below-described solvent contained in the layer B can be extracted from the surface of the layer A.

Further, the ratio of the total mass of the components (a) and (b) to the mass of the component (c) in the total solid content forming the layer A is preferably from 1:0.02 to 1:0.5. If the ratio of the total mass of the components (a) and (b) to the mass of the component (c) is from 1:0.02 to 1:0.5, the joining strength between the adhesive film and the conductor layer (electroless copper plating) can be increased. If the ratio of the component (c) is less than 0.02, the joining strength between the adhesive film and the conductor layer is decreased, and therefore, such a ratio is not preferred. Meanwhile, if the ratio of the component (c) exceeds 0.5, the laser processability of the insulating layer obtained by thermally curing the adhesive film is deteriorated so that a residue (smear) of the adhesive film may be increased or the shape of the via-hole after processing may be deteriorated.

As for the blending amount of the component (e) among the components forming the layer A, the ratio of the mass of the component (e) to the mass of the component (a) is from 1:0.1 to 1:10, more preferably from 1:0.2 to 1:5, further more preferably from 1:0.5 to 1:3.3.

If the ratio of the mass of the phenoxy resin which is the component (e) to the mass of the component (a) is in the range from 1:0.1 to 1:10, the joining strength between the insulating layer formed by curing the layer A and the layer B and the conductor layer (electroless copper plating) can be improved, and also the blister defects of the conductor layer can be suppressed.

The blending amount of the filler used as the component (c) is preferably within the range from 3 to 35% by mass with respect to the mass of the adhesive film. If the blending amount of the filler is from 3 to 35% by mass, the scattering of smears can be suppressed, and also the accuracy of the shape of the via-hole can be kept within an acceptable range. Further, if the blending amount of the filler is from 3 to 35% by mass, the joining strength between the adhesive film and the conductor layer can be increased.

Further, in the layer A of the adhesive film of the present invention, a component other than the resin composition containing the components (a), (b), (c), and (e) may be contained. In the case where a component other than the resin composition containing the components (a), (b), (c), and (e) is contained, the total blending amount of the components (a), (b), (c), and (e) with respect to 100 parts by mass of the resin composition containing the components (a), (b), (c), and (e) is required to be 70 parts by mass or more. The blending amount of the resin composition containing the components (a), (b), (c), and (e) is more preferably 75% by mass or more, further more preferably 80% by mass or more.

If the blending amount of the resin composition containing the components (a), (b), (c), and (e) in the resin composition constituting the layer A is less than 70% by mass, the effect of the present application such that the adhesion strength between the adhesive film and the conductor layer is increased while making the surface roughness of the interlayer insulating layer of the adhesive film smooth is not sufficiently obtained, and therefore, such a blending amount is not preferred.

<Layer B>

The same one as the layer B described in the first embodiment can be applied.

<Layer C>

The same one as the layer C described in the first embodiment can be applied.

<Protective Film>

The same one as the protective film described in the first embodiment can be applied.

<Method for Preparing Adhesive Film>

The adhesive film can be prepared in the same manner as described in the first embodiment except that the component (e) is used in place of the component (d).

[Method for Manufacturing Multilayer Printed Wiring Board]

A method for manufacturing a multilayer printed wiring board using the adhesive film of the present invention will be described. The method for manufacturing a multilayer printed wiring board of the present invention includes the following steps (1) to (6), and further includes a step of peeling off or removing the layer C after any of the steps (1), (2), and (3):

step (1): a step of laminating the above-described adhesive film including the layer A, the layer B, and the layer C on one surface or both surfaces of a circuit board;

step (2): a step of forming an insulating layer by thermally curing the layer A and the layer B constituting the adhesive film in the circuit board having the adhesive film laminated thereon;

step (3): a step of forming a hole in the circuit board having the insulating layer formed thereon;

step (4): a step of removing a residue of the adhesive film remaining in the hole;

step (5): a step of forming a conductor layer on the circuit board from which the residue has been removed; and step (6): a step of forming a circuit pattern on the insulating layer having the conductor layer formed thereon.

Step (1)

The adhesive film of the present invention can be preferably laminated on one surface or both surfaces of a circuit board using a commercially available vacuum laminator. In the lamination step, the adhesive film is press-bonded to the circuit board while being pressed and heated in a state where the film is placed on the circuit board. In the case where the adhesive film has a protective film, the protective film is removed before the lamination step.

Examples of the vacuum laminator include a vacuum applicator manufactured by Nichigo-Morton Co., Ltd., a vacuum pressure-type laminator manufactured by Meiki Co., Ltd., a roll-type dry coater manufactured by Hitachi Industries Ltd., and a vacuum laminator manufactured by Hitachi AIC, Inc.

The temperature condition in the lamination step is preferably from 60 to 140° C., the press-bonding pressure is preferably from 1 to 11 kgf/cm$^2$ ($9.8 \times 10^4$ N/m$^2$ to $107.9 \times 10^4$ N/m$^2$), and the environmental pressure is preferably a reduced pressure of 20 mmHg (26.7 hPa) or less (air pressure). Under the above-described condition, a laminate in which the adhesive film is laminated on the circuit board is formed. After the lamination step, the laminate is cooled to near room temperature. After cooling, the layer C serving as the support is peeled off or removed.

In the lamination step, the adhesive film and the circuit board on which the adhesive film is laminated may be preheated as needed. The lamination process may be a batch process or a continuous process using a roll. Incidentally, the surface of the circuit board before the adhesive film is laminated is preferably subjected to a roughening treatment such as a blackening treatment in advance.

Step (2)

Subsequently, the layer A and the layer B laminated on the circuit board are heated and cured. By this heating and curing, an insulating layer is formed. The temperature condition is set to preferably 150 to 220° C., more preferably 160 to 200° C. The heating time when the temperature condition is from 150 to 220° C. is preferably set to 20 to 80 minutes. Further, the heating time when the temperature condition is from 160 to 200° C. is preferably set to 30 to 120 minutes.

In the case where the surface of the layer C serving as the support has been subjected to a release treatment, the layer C can be peeled off after the step (2) in which the adhesive film is heated and cured.

Incidentally, when the layer structure of the adhesive film is described, the layer A and the layer B are distinguished from each other, however, after the layer A and the layer B laminated on the circuit board are heated and cured, these layers sometimes are in a state that a clear boundary between the layer A and the layer B does not exist. For example, part of the components constituting the layer A and part of the components constituting the layer B are sometimes in a miscible state with each other. Those in which the boundary portion is in such a state are also included in the adhesive film of the present invention.

Step (3)

The circuit board having an insulating layer composed of the layer A and the layer B formed thereon is subjected to a drilling process, a laser process, a plasma process, or a combination thereof, whereby a via-hole is formed. As the laser, a carbon dioxide gas laser, a YAG laser, a UV laser, an excimer laser, or the like can be used. In the case where the surface of the layer C serving as the support has been subjected to a release treatment, the step of peeling off or removing the layer C may be performed at any time after performing the step (2) in which the adhesive film is heated and cured, and the layer C may be peeled off or removed after performing the step (3).

Step (4)

Subsequently, a residue (smear) of the adhesive film remaining in the via-hole formed in the step (3) is removed using an oxidizing agent, and also a roughening/desmear treatment in which the surface of the insulating layer is roughened is performed.

As the oxidizing agent which can be used in the roughening/desmear treatment, a permanganate (such as potassium permanganate or sodium permanganate), a bichromate, ozone, hydrogen peroxide, sulfuric acid, nitric acid, or the like can be used. In the desmear treatment, it is preferred to use an alkaline permanganic acid solution (for example, an aqueous sodium hydroxide solution of potassium permanganate or sodium permanganate), which is generally used for roughening an insulating layer when manufacturing a multilayer printed wiring board by a build-up process. In this manner, the smear in the via-hole can be removed, and also the surface of the insulating layer can be roughened.

Step (5)

A conductor layer is formed in the via-hole from which the smear has been removed by the roughening/desmear treatment, and on the surface of the insulating layer of the adhesive film by a method in which electroless plating and electrolytic plating are combined. After forming the conductor layer in the via-hole and on the surface of the insulating layer, an annealing treatment is performed at 150 to 200° C. for 20 to 90 minutes. By doing this, the adhesion strength between the insulating layer and the conductor layer can be improved. Incidentally, in the step (5), the conductor layer may be formed by electroless plating alone by forming a plating resist having a reverse pattern to the wiring pattern.

Step (6)

On the insulating layer on the outermost side where the conductor layer is formed, a circuit pattern is generally formed. As the method for forming the circuit pattern, for example, a subtractive method, a semi-additive method, or the like known to those skilled in the art can be used. By repeating the steps (1) to (6), a multilayer printed wiring board can be manufactured.

EXAMPLES

Next, the present invention will be described in more detail with reference to Examples, however, the present invention is not limited to these descriptions.

[Examples Using Adhesive Film According to First Embodiment]

From adhesive films obtained in the respective Examples and Comparative Examples, laser-processed circuit boards, circuit boards for measuring a surface roughness, and circuit boards for measuring a peel strength were prepared according to the following methods, and the properties were measured and evaluated.

(Preparation of Laser-Processed Circuit Board)

On a copper clad laminate plate with a copper foil of 18 μm and a plate thickness of 0.4 mm, MCL-E-679F (trade name, manufactured by Hitachi Chemical Co., Ltd.) having a circuit board formed in advance thereon, each of adhesive films obtained in Examples and Comparative Examples was laminated using a batch-type vacuum pressure laminator MVLP-500 (trade name, manufactured by Meiki Co., Ltd.). At this time, the degree of vacuum was 4 kPa (30 mmHg) or less, and the temperature and the pressure were set to 90° C. and 0.5 MPa, respectively. After the laminate plate was cooled to room temperature, the support film (C) was peeled off, followed by curing in a dry atmosphere at 180° C. for 60 minutes, whereby a circuit board with an interlayer insulating layer was obtained. Subsequently, a via-hole for interlayer connection was formed at a site necessary for this interlayer insulating layer. The via-hole was formed by processing using a carbon dioxide gas laser processing machine (LCO-1B21) manufactured by Hitachi Via Mechanics Ltd. under the following conditions: the beam diameter: 60 μm, frequency: 500 Hz, pulse width: 5 μs, and shot count: 2.

(Preparation of Circuit Board for Measuring Surface Roughness)

By using a part of the laser-processed circuit board as a test piece, a roughening treatment was performed. As a swelling solution, CIRCUPOSIT MLB CONDITIONER 211 manufactured by Rohm & Haas Electronic Materials CMP, Inc. was used, and the test piece was immersed in the solution heated to 80° C. for 3 minutes. Subsequently, as a roughening solution, CIRCUPOSIT MLB PROMOTER 213 manufactured by Rohm & Haas Electronic Materials CMP, Inc. was used, and the test piece was immersed in the solution heated to 80° C. for 8 minutes. Then, as a neutralizing solution, CIRCUPOSIT MLB NEUTRALIZER MLB 216 manufactured by Rohm & Haas Electronic Materials CMP, Inc. was used, and the test piece was immersed in the solution heated to 45° C. for 5 minutes, thereby effecting neutralization.

In this manner, a circuit board for measuring a surface roughness in which the surface of the interlayer insulating layer was subjected to a roughening treatment was prepared.

(Preparation of Circuit Board for Measuring Peel Strength)

By using a part of the circuit board for measuring a surface roughness as a test piece, an electroless plating treatment was performed, and then, a copper layer was formed by performing electrolytic plating in combination, whereby a circuit board for measuring an adhesion strength (peel strength) between the interlayer insulating layer and the conductor layer (copper layer) was prepared. First, the test piece was immersed in a catalyst solution for electroless plating containing $PdCl_2$ (HS-202B, trade name, manufactured by Hitachi Chemical Co., Ltd.) at room temperature (25° C.) for 10 minutes, washed with water, and then, immersed in a plating solution for electroless copper plating (CUST-201, trade name, manufactured by Hitachi Chemical Co., Ltd.) at room temperature for 15 minutes, whereby an electroless plating having a thickness of about 0.5 μm was formed on the surface of the interlayer insulating layer subjected to the roughening treatment. Further, a copper layer having a thickness of about 25 μm was formed by electrolytic plating.

In order to measure the adhesion strength of the copper layer, a resist having a width of 1 mm was formed on the test piece, and the copper layer was etched with ferric chloride, whereby a circuit board for measuring an adhesion strength was obtained.

(Evaluation Method for "Resin Scattering and Irregular Via Shape" in Laser-Processed Circuit Board)

By using the laser-processed circuit board obtained according to the above-described "Preparation of Laser-Processed Circuit board", the laser-processed circuit board was evaluated. By using a laser-processed portion of the laser-processed circuit board, a roughening treatment of the circuit board was performed under the same roughening condition as shown in the above-described "Preparation of Circuit Board for Measuring Surface Roughness". Thereafter, the surface of a via portion was observed and also the cross-sectional shape of some vias was observed.

The observation and evaluation were performed as follows. The observation was performed using an electron microscope (SEM) 54700 (trade name) manufactured by Hitachi, Ltd., and after the roughening treatment, a case where resin scattering was observed or an irregular via shape was observed when observing the surface was evaluated as bad. Further, a case where the results of such observation were good was evaluated as good.

(Measurement Method for Surface Roughness)

By using the circuit board for measuring a surface roughness obtained as described above, the surface roughness of an interlayer insulating layer portion in a solid part subjected to the roughening treatment was measured. The surface roughness Ra was measured using Micromap MN5000 manufactured by Ryoka Systems, Inc. In view of the object of the present invention, Ra is preferably smaller in order to form a fine wiring, and therefore, a case where Ra was less than 0.3 μm was determined to be acceptable.

(Measurement Method for Copper Foil Peel-off Strength (Peel Strength))

By using the circuit board for measuring a peel strength obtained as described above, the adhesion strength between the interlayer insulating layer and the conductor layer was measured. One end of copper is peeled off at an interface between the cooper layer and the interlayer insulating layer and gripped by a gripper. Then, a load when performing peeling in the vertical direction at a tension rate of 50 mm/min at room temperature was measured. In view of the object of the present invention, the adhesion strength is preferably higher, and a case where an adhesion strength of more than 0.6 kN/m was obtained was determined to be acceptable.

(Preparation of Varnish for Layer A and Coating Resin Film)
Preparation Example 1 (Preparation of Resin Film 1)

62.7 Parts by mass of a multifunctional epoxy resin NC3000-H (trade name, solid content concentration: 100% by mass) manufactured by Nippon Kayaku Co., Ltd. as the epoxy resin in the thermosetting resin (a1) of the layer A, 23.7 parts by mass of a triazine-containing phenolic novolac resin LA-1356-60P (trade name, solid content concentration: 60% by mass) manufactured by DIC Corporation as the curing agent, 0.6 parts by mass of 2-phenylimidazole (trade name, solid content concentration: 100% by mass, referred to as 2PZ) manufactured by Shikoku Chemicals Corporation as the curing accelerator, 8.8 parts by mass of fumed silica, AEROSIL R972 (trade name, solid content concentration: 100%, specific surface area: 110±20 m$^2$/g (catalog value)) manufactured by Japan Aerosil Co., Ltd. as the inorganic filler (b1) of the layer A, 136.8 parts by mass of a polyamide resin BPAM-155 (trade name) manufactured by Nippon Kayaku Co., Ltd. dissolved in a dimethylacetamide solvent so that the solid content concentration was 10% by mass as the heat-resistant resin (c1) of the layer A, and further 51.0 parts by mass of a dimethylacetamide solvent and 121.4 parts by mass of a methyl ethyl ketone solvent were added, dissolved, mixed, and then, subjected to a bead mill dispersion treatment, whereby a varnish was prepared.

As the support film (layer C), a polyethylene terephthalate film (PET film) having a thickness of 38 μm was used, and this varnish was applied thereto by a comma coater, followed by drying. The coating thickness was set to 5 μm, and the drying temperature and the drying time were set to 140° C. and 3 minutes, respectively, whereby a resin film 1 was obtained.

Preparation Example 2 (Preparation of Resin Film 2)

57.1 Parts by mass of NC3000-H (solid content concentration: 100% by mass) as the epoxy resin in the thermosetting resin (a1) of the layer A, 21.6 parts by mass of LA-1356-60P (solid content concentration: 60% by mass) as the curing agent, 0.6 parts by mass of 2PZ (solid content concentration: 100% by mass) as the curing accelerator, 16.9 parts by mass of AEROSIL R972 (trade name, solid content concentration: 100% by mass) as the inorganic filler (b1) of the layer A, 124.6 parts by mass of BPAM-155 dissolved in a dimethylacetamide solvent so that the concentration was 10% by mass as the heat-resistant resin (c1) of the layer A, and further 59.5 parts by mass of a dimethylacetamide solvent and 106.1 parts by mass of a methyl ethyl ketone solvent were added, and in the same manner as in Preparation Example 1, a resin film 2 was obtained.

Preparation Example 3 (Preparation of Resin Film 3)

65.0 Parts by mass of NC3000-H (solid content concentration: 100% by mass) as the epoxy resin in the thermosetting resin (a1) of the layer A, 24.6 parts by mass of LA-1356-60P (solid content concentration: 60% by mass) as the curing agent, 0.7 parts by mass of 2PZ (solid content concentration: 100% by mass) as the curing accelerator, 5.4 parts by mass of AEROSIL R972 (trade name, solid content concentration: 100% by mass) as the inorganic filler (b1) of the layer A, 142.0 parts by mass of BPAM-155 dissolved in a dimethylacetamide solvent so that the solid content concentration was 10% by mass as the heat-resistant resin (c1) of the layer A, and further 52.3 parts by mass of a dimethylacetamide solvent and 120.8 parts by mass of a methyl ethyl ketone solvent were added, and in the same manner as in Preparation Example 1, a resin film 3 was obtained.

Preparation Example 4 (Preparation of Resin Film 4)

59.0 Parts by mass of NC3000-H (solid content concentration: 100% by mass) as the epoxy resin in the thermosetting resin (a1) of the layer A, 22.3 parts by mass of LA-1356-60P (solid content concentration: 60% by mass) as the curing agent, 0.6 parts by mass of 2PZ (solid content concentration: 100% by mass) as the curing accelerator, 8.8 parts by mass of AEROSIL R972 (trade name, solid content concentration: 100% by mass) as the inorganic filler (b1) of the layer A, 18.2 parts by mass of core-shell rubber particles EXL-2655 (trade name, solid content concentration: 100% by mass, average particle diameter: 0.5 μm) manufactured by Rohm & Haas Electronic Materials CMP, Inc. as the crosslinked organic filler (d1) of the layer A, and further 43.9 parts by mass of a dimethylacetamide solvent and 213.5 parts by mass of a methyl ethyl ketone solvent were added, and in the same manner as in Preparation Example 1, a resin film 4 was obtained.

Preparation Example 5 (Preparation of Resin Film 5)

62.7 Parts by mass of NC3000-H (solid content concentration: 100% by mass) as the epoxy resin in the thermosetting resin (a1) of the layer A, 23.7 parts by mass of LA-1356-60P (solid content concentration: 60% by mass) as the curing agent, 0.6 parts by mass of 2PZ (solid content concentration: 100% by mass) as the curing accelerator, 8.8 parts by mass of fumed silica AEROSIL R202 (trade name, solid content concentration: 100% by mass, specific surface area: 100±20 m$^2$/g (catalog value)) manufactured by Japan Aerosil Co., Ltd. as the inorganic filler (b1) of the layer A, 136.8 parts by mass of BPAM-155 dissolved in a dimethylacetamide solvent so that the solid content concentration was 10% by mass as the heat-resistant resin (c1) of the layer A, and further 51.0 parts by mass of a dimethylacetamide solvent and 121.4 parts by mass of a methyl ethyl ketone solvent were added, and in the same manner as in Preparation Example 1, a resin film 5 was obtained.

Comparative Preparation Example 1 (Preparation of Resin Film 6)

62.7 Parts by mass of NC3000-H (solid content concentration: 100% by mass) as the epoxy resin in the thermosetting resin (a1) of the layer A, 23.7 parts by mass of LA-1356-60P (solid content concentration: 60% by mass) as the curing agent, 0.6 parts by mass of 2PZ (solid content concentration: 100% by mass) as the curing accelerator, 12.6 parts of a material obtained by treating spherical silica SO-C2 (trade name, specific surface area: 6.8 m$^2$/g (catalog value)) manufactured by Admatechs Co., Ltd. with an aminosilane coupling agent, and adding a methyl isobutyl ketone solvent thereto so that the solid content concentration was 70% by mass as the inorganic filler (b1) of the layer A, 136.8 parts by mass of BPAM-155 dissolved in a dimethylacetamide solvent so that the concentration was 10% by mass as the heat-resistant resin (c1) of the layer A, and further 51.0 parts by mass of a dimethylacetamide solvent and 117.6 parts by mass of a methyl ethyl ketone solvent were added, and in the same manner as in Preparation Example 1, a resin film 6 was obtained.

Comparative Preparation Example 2 (Preparation of Resin Film 7)

62.7 Parts by mass of NC3000-H (solid content concentration: 100% by mass) as the epoxy resin in the thermosetting resin (a1) of the layer A, 23.7 parts by mass of LA-1356-60P (concentration: 60% by mass) as the curing agent, 0.6 parts by mass of 2PZ (solid content concentration: 100% by mass) as the curing accelerator, 12.6 parts of a material obtained by treating spherical silica SO-C1 (trade name, specific surface area: 17.4 m$^2$/g (catalog value)) manufactured by Admatechs Co., Ltd. with an aminosilane coupling agent, and adding a methyl isobutyl ketone solvent thereto so that the solid content concentration was 70% by mass as the inorganic filler (b1) of the layer A, 136.8 parts by mass of BPAM-155 dissolved in a dimethylacetamide solvent so that the concentration was 10% by mass as the heat-resistant resin (c1) of the layer A, and further 51.0 parts by mass of a dimethylacetamide solvent and 117.6 parts by mass of a methyl ethyl ketone solvent were added, and in the same manner as in Preparation Example 1, a resin film 7 was obtained.

Comparative Preparation Example 3 (Preparation of Resin Film 8)

68.7 Parts by mass of NC3000-H (solid content concentration: 100% by mass) as the epoxy resin in the thermosetting resin (a1) of the layer A, 26.0 parts by mass of LA-1356-60P (solid content concentration: 60% by mass) as the curing agent, 0.7 parts by mass of 2PZ (solid content concentration: 100% by mass) as the curing accelerator, 150.0 parts by mass of BPAM-155 dissolved in a dimethylacetamide solvent so that the solid content concentration was 10% by mass as the heat-resistant resin (c1) of the layer A, and further 54.3 parts by mass of a dimethylacetamide solvent and 119.9 parts by mass of a methyl ethyl ketone solvent were added, but the inorganic filler (b1) was not blended, and in the same manner as in Preparation Example 1, a resin film 8 was obtained.

Comparative Preparation Example 4 (Preparation of Resin Film 9)

42.6 Parts by mass of NC3000-H (solid content concentration: 100% by mass) as the epoxy resin in the thermosetting resin (a1) of the layer A, 16.2 parts by mass of LA-1356-60P (solid content concentration: 60% by mass) as the curing agent, 0.4 parts by mass of 2PZ (solid content concentration: 100% by mass) as the curing accelerator, 37.9 parts by mass of fumed silica, AEROSIL R972 (trade name, solid content concentration: 100% by mass, specific surface area: 100±20 m$^2$/g (catalog value)) manufactured by Japan Aerosil Co., Ltd. as the inorganic filler (b1) of the layer A, 93.1 parts by mass of BPAM-155 dissolved in a dimethylacetamide solvent so that the solid content concentration was 10% by mass as the heat-resistant resin (c1), and further 42.5 parts by mass of a dimethylacetamide solvent and 126.4 parts by mass of a methyl ethyl ketone solvent were added, and in the same manner as in Preparation Example 1, a resin film 9 was obtained.

Preparation Example B (Preparation of Varnish for Layer B)

31.8 Parts by mass of NC3000-H (solid content concentration: 100% by mass) as the epoxy resin in the thermosetting resin (a2) of the layer B, 7.2 parts by mass of a triazine-containing cresol novolac resin LA-3018-50P (trade name, solid content concentration: 50% by mass) manufactured by DIC Corporation as the curing agent, 5.1 parts by mass of HCA-HQ (trade name, solid content concentration: 100% by mass) manufactured by SANKO Company Limited as the phosphorus-containing phenolic resin, 4.4 parts by mass of phenol novolac TD 2131 (solid content concentration: 100% by mass) manufactured by DIC Corporation, 0.1 parts by mass of 1-cyanoethyl-2-phenyl imidazolium trimellitate 2PZCNS-PW (trade name, solid content concentration: 100% by mass) manufactured by Shikoku Chemicals Corporation as the curing accelerator, and 78.6 parts by mass of a silica filler SO-C2 treated with an aminosilane coupling agent (in a methyl isobutyl ketone solvent, solid content concentration: 70% by mass) as the inorganic filler (b2) were added, and further 42.7 parts by mass of methyl ethyl ketone was blended therein as an additional solvent so that the solid content concentration was 70% by mass, and in the same manner as in Preparation Example 1, these components were dissolved, mixed, and then, subjected to a bead mill dispersion treatment, whereby a varnish for the layer B was prepared.

Incidentally, the amount of the above-described silica filler SO-C2 is 55% by mass in the resin composition for the layer B.

The lowest melting temperature of the obtained thermosetting resin (a2) of the layer B was 80° C. Incidentally, the measurement was performed for the obtained thermosetting resin (a2) of the layer B according to the measurement method disclosed in WO 01/97582 as described above. As the measurement device, a rheometer (ARES-2KSTD) manufactured by TA Instruments, Inc. was used, and the measurement was performed at a measurement starting temperature of 40° C. and a temperature rise rate of 5° C./min.

Examples 1 to 5 and Comparative Examples 1 to 4

Adhesive films were prepared by the following method using the varnish for the layer B obtained in Preparation Example B on each of the resin films 1 to 9 obtained in Preparation Examples 1 to 5 and Comparative Preparation Examples 1 to 4.

That is, the varnish for the layer B was applied to each of the resin films 1 to 9 on the side of the layer A using a comma coater, followed by drying. The coating thickness was set such that the thickness of the layer A was 35 μm and the thickness of the layer B was 35 μm, and the drying temperature and the drying time were set to 105° C. and 1.2 minutes, respectively.

The composition (solid content mass ratio) of the thermosetting resin (a1) of the layer A of each of the obtained adhesive films, and the results of measurement and evaluation of the properties are shown in Table 1.

TABLE 1

| Composition of layer A (solid content (parts by mass)) | | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| Thermosetting resin (a1) | Polyfunctional epoxy resin (NC3000-H) | 62.7 | 57.1 | 65.0 | 59.0 | 62.7 | 62.7 | 62.7 | 68.7 | 42.6 |
| | Curing agent (LA-1356-60P) | 14.2 | 13.0 | 14.8 | 13.4 | 14.2 | 14.2 | 14.2 | 15.6 | 9.7 |
| | Curing accelerator (2PZ) | 0.6 | 0.6 | 0.7 | 0.6 | 0.6 | 0.6 | 0.6 | 0.7 | 0.4 |
| Inorganic filler (b1) | Fumed silica (AEROSIL R972) | 8.8 | 16.9 | 5.4 | 8.8 | 0 | 0 | 0 | 0 | 37.9 |
| | Fumed silica (AEROSIL R202) | 0 | 0 | 0 | 0 | 8.8 | 0 | 0 | 0 | 0 |
| | Spherical silica (SO-C2) | 0 | 0 | 0 | 0 | 0 | 8.8 | 0 | 0 | 0 |
| | Spherical silica (SO-C1) | 0 | 0 | 0 | 0 | 0 | 0 | 8.8 | 0 | 0 |
| Heat-resistant resin (c1) | Polyamide resin (BPAM-155) | 13.7 | 12.5 | 14.2 | 0 | 13.7 | 13.7 | 13.7 | 15.0 | 9.3 |
| Crosslinked organic filler (d1) | Core-shell rubber particles (EXL-2655) | 0 | 0 | 0 | 18.2 | 0 | 0 | 0 | 0 | 0 |
| Composition of layer A (solid content mass ratio) | Thermosetting resin (a1): Inorganic filler (b1) | 9:1 | 5:1 | 15:1 | 8:1 | 9:1 | 9:1 | 9:1 | — | 14:10 |
| | Thermosetting resin (a1): Heat-resistant resin (c1) | 6:1 | 6:1 | 6:1 | — | 6:1 | 6:1 | 6:1 | 6:1 | 6:1 |
| | Thermosetting resin (a1): Crosslinked organic filler (d1) | — | — | — | 4:1 | — | — | — | — | — |
| Evaluation results (laser-processed circuit board) | Resin scattering, irregular via shape | Absent | Absent | Absent | Absent | Absent | Absent | Absent | Present | Absent |
| | Surface roughness after roughening (Ra: μm) | 0.25 | 0.23 | 0.23 | 0.28 | 0.21 | 0.45 | 0.31 | 0.21 | 0.18 |
| | Copper foil peel off strength (peel strength: kgf/cm) | 0.71 | 0.70 | 0.67 | 0.62 | 0.64 | 0.75 | 0.78 | 0.61 | 0.41 |

From Table 1, it is found that in the case of the adhesive films of Examples, the laser processability is favorable, an irregular via shape is not formed, the surface roughness Ra in the laser-processed portion after the roughening treatment is small so that it is advantageous to form a fine wiring, and the copper foil peel-off strength (peel strength) is high.

Accordingly, by using the adhesive film of the present invention, it becomes possible to form a conductor layer having a high adhesion strength on a smooth interlayer insulating layer.

On the other hand, Table 1 shows that in the case of the adhesive films of Comparative Examples, when forming the resin composition for an interlayer insulating layer on the support film, resin scattering is observed in the laser-processed portion after the roughening treatment or the via has an unfavorable shape. Further, a roughened shape is large or the adhesion strength between the conductor layer and the interlayer insulating layer is low, and thus, it is found that the adhesive films of Comparative Examples are not suitable for forming a fine wiring.

[Examples Using Adhesive Film According to Second Embodiment]

Hereinafter, the present invention will be specifically described by showing a second example.

<Preparation of Varnish for Forming Layer A>

Varnishes A1 to A16

Varnishes A1 to A16 were prepared by mixing the respective components (a) to (d) and the organic solvent shown in the following Table 2 in blending amounts shown therein, and performing a bead mill dispersion treatment.

TABLE 2

| Parts by mass (solid content (parts by mass)) | | Concentration (%) | A1 | A2 | A3 | A4 | A5 | A6 | A7 | A8 | A9 | A10 | A11 | A12 | A13 | A14 | A15 | A16 |
|---|---|---|---|---|---|---|---|---|---|---|---|---|---|---|---|---|---|---|
| Component (a) | a-1 | 10 | 135.4 (13.5) | 135.4 (13.5) | 0.0 (0.0) | 72.2 (7.2) | 225.7 (22.6) | 136.4 (13.6) | 130.3 (13.0) | 140.5 (14.1) | 123.4 (12.3) | 0.0 (0.0) | 541.8 (54.2) | 136.8 (13.7) | 105.2 (10.5) | 148.5 (14.9) | 52.4 (5.2) | 0 0 |
| | a-2 | 10 | 0.0 (0.0) | 0.0 (0.0) | 135.4 (13.5) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0 0 |
| | a-3 | 15 | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 398.4 (59.8) |
| Component (b) | b-1 | 100 | 62.0 (62.0) | 62.0 (62.0) | 62.0 (62.0) | 67.1 (67.1) | 54.7 (54.7) | 62.5 (62.5) | 59.7 (59.7) | 64.4 (64.4) | 56.5 (56.5) | 73.0 (73.0) | 29.2 (29.2) | 62.7 (62.7) | 48.2 (48.2) | 68.0 (68.0) | 24.0 (24.0) | 0 0 |
| | b-2 | 60 | 23.5 (14.1) | 23.5 (14.1) | 23.5 (14.1) | 25.4 (15.3) | 20.7 (12.4) | 23.7 (14.2) | 22.6 (13.6) | 24.4 (14.6) | 21.4 (12.8) | 27.7 (16.6) | 11.1 (6.6) | 23.7 (14.2) | 18.3 (11.0) | 25.8 (15.5) | 9.1 (5.5) | 0 0 |
| | b-3 | 100 | 0.6 (0.6) | 0.6 (0.6) | 0.6 (0.6) | 0.7 (0.7) | 0.5 (0.5) | 0.6 (0.6) | 0.6 (0.6) | 0.6 (0.6) | 0.6 (0.6) | 0.7 (0.7) | 0.3 (0.3) | 0.6 (0.6) | 0.5 (0.5) | 0.7 (0.7) | 0.2 (0.2) | 0 0 |
| | b-4 | 100 | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 26.0 (26.0) |
| | b-5 | 60 | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 11.3 (6.8) |
| Component (c) | c-1 | 100 | 8.8 (8.8) | 8.8 (8.8) | 8.8 (8.8) | 8.8 (8.8) | 8.8 (8.8) | 8.8 (8.8) | 8.8 (8.8) | 5.4 (5.4) | 16.9 (16.9) | 8.8 (8.8) | 8.8 (8.8) | 8.8 (8.8) | 8.8 (8.8) | 0.0 (0.0) | 64.7 (64.7) | 0 0 |
| | c-2 | 100 | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 3.5 (3.5) |
| Component (d) | d-1 | 25 | 3.6 (0.9) | 0.0 (0.0) | 3.6 (0.9) | 3.6 (0.9) | 3.6 (0.9) | 1.1 (0.3) | 17.4 (4.3) | 3.7 (0.9) | 3.3 (0.8) | 3.6 (0.9) | 3.6 (0.9) | 0.0 (0.0) | 84.2 (21.0) | 4.0 (1.0) | 1.4 (0.3) | 0 0 |
| | d-2 | 15 | 0.0 (0.0) | 6.0 (0.9) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0 0 |
| | d-3 | 31 | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 0.0 (0.0) | 13 (4.0) |
| Total solid amount | | | (100.0) | (100.0) | (100.0) | (100.0) | (100.0) | (100.0) | (100.0) | (100.0) | (100.0) | (100.0) | (100.0) | (100.0) | (100.0) | (100.0) | (100.0) | (100.0) |
| Organic solvent | | | 314.3 | 314.3 | 314.3 | 364.0 | 241.4 | 314.3 | 309.8 | 309.8 | 328.0 | 432.8 | 0.0 | 314.3 | 282.4 | 300.7 | 396.3 | 0 |
| (a):(b) | | | 10:57 | 10:57 | 10:57 | 1:12 | 1:3 | 10:57 | 10:57 | 10:57 | 10:57 | 0:1 | 10:7 | 10:57 | 10:57 | 10:57 | 10:57 | 9.5 |
| ((a) + (b)):(c) | | | 10:1 | 10:1 | 10:1 | 7:1 | 10:1 | 10:1 | 10:1 | 17:1 | 5:1 | 10:1 | 10:1 | 10:1 | 8:1 | 1:0 | 1:2 | 27:1 |
| (a):(d) | | | 15:1 | 15:1 | 15:1 | 8:1 | 25:1 | 50:1 | 3:1 | 15:1 | 15:1 | 0:1 | 600:1 | 1:0 | 1:2 | 15:1 | 15:1 | 15:1 |
| Total mass % of (a) to (d) | | | 100 | 100 | 100 | 100 | 100 | 100 | 100 | 100 | 100 | 100 | 100 | 100 | 100 | 100 | 100 | 100 |

The respective components in Table 2 are as follows.

a-1: a polyamide resin "BPAM-155" (manufactured by Nippon Kayaku Co., Ltd.)

a-2: a polyamide resin "BPAM-01" (manufactured by Nippon Kayaku Co., Ltd.)

a-3: polyamideimide "HR11NN" (non-volatile content: 15% by mass, rupture strength: 150 MPa, rupture elongation: 80%, thermal expansion coefficient: 42 ppm, glass transition temperature: 300° C., manufactured by Toyobo Co., Ltd.)

b-1: a biphenyl-type epoxy resin "NC3000-H" (manufactured by Nippon Kayaku Co., Ltd.)

b-2: a curing agent, a triazine-containing phenolic novolac resin "LA-1356-60P" (manufactured by DIC Corporation)

b-3: a curing accelerator, 2-phenylimidazole (manufactured by Shikoku Chemicals Corporation)

b-4: a bisphenol A-type epoxy resin "EPIKOTE 828" (epoxy equivalent: 190, manufactured by Japan Epoxy Resin Co., Ltd.)

b-5: a 2-butanone solution of a triazine ring-containing phenol novolac resin "Phenolite LA-7052" (non-volatile content: 60% by mass, phenolic hydroxyl group equivalent of non-volatile content: 120, manufactured by Dainippon Ink and Chemicals, Inc.)

c-1: fumed silica "AEROSIL R972" (manufactured by Japan Aerosil Co., Ltd.)

c-2: a mixture of 1 part of silicone resin particles having a flat shape "AGM101" (average particle diameter: 0.41 μm) (manufactured by TAKEMOTO OIL & FAT Co., Ltd.) and 3 parts of spherical silica (average particle diameter: 1 μm)

d-1: a polyester-modified polydimethylsiloxane "BYK-310" (manufactured by Big Chemie Japan Co., Ltd.)

d-2: a polyester-modified polydimethylsiloxane "BYK-313" (manufactured by Big Chemie Japan Co., Ltd.)

d-3: a siloxane-modified polyamideimide "KS9100" (non-volatile content: 31% by mass, manufactured by Hitachi Chemical Co., Ltd.)

Organic solvent: dimethylacetamide

<Preparation of Layer B>

A varnish B for forming the layer B was prepared by mixing the respective components shown in the following Table 3 in blending amounts shown therein, and performing a bead mill dispersion treatment.

TABLE 3

| Parts by mass (solid content (parts by mass)) | Concentration (%) | Varnish B |
| --- | --- | --- |
| Component (e) | 100 | 31.8 (31.8) |
| Component (f) | 50 | 7.2 (3.6) |
| Component (g) | 100 | 5.1 (5.1) |
| Component (h) | 100 | 4.4 (4.4) |
| Component (i) | 100 | 0.1 (0.1) |
| Component (j) | 70 | 78.6 (55.0) |
| Total solid amount | | 100.0 |
| Organic solvent | | 42.7 |

The respective components in Table 3 are as follows.

e: a biphenyl-type epoxy resin "NC3000-H"

f: a curing agent, triazine-containing cresol novolac "LA-3018-50P" (manufactured by DIC Corporation)

g: a phosphorus-containing phenolic resin "HCA-HQ-HS" (manufactured by SANKO Company Limited)

h: a phenol novolac resin "TD2131" (manufactured by DIC Corporation)

i: a curing accelerator, 1-cyanoethyl-2-phenyl imidazolium trimellitate "2PZ-CNS-PW" (manufactured by Shikoku Chemicals Corporation)

j: a filler, a silica filler "SO-C2" (manufactured by Admafine Techno) (average particle diameter: 0.5 μm) treated with an aminosilane coupling agent in a methyl isobutyl ketone solvent Organic solvent: dimethylacetamide <Preparation of Adhesive Film of Example 2>

As the support (layer C), a polyethylene terephthalate film (PET film) having a thickness of 38 μm was used. On the surface of the PET film, the varnish A1 was applied using a comma coater so that the thickness after the application was 5 μm, followed by drying. The drying conditions were set as follows: drying temperature: 140° C., and drying time: 3 minutes. By doing this, a laminate 1 having the layer A formed by the varnish A1 and the layer C was formed.

Subsequently, the layer B was formed on the layer A of the thus obtained laminate 1. The method for forming the layer B is as follows. The varnish B for forming the layer B was applied to the laminate on the side of the layer A using a comma coater so that the thickness after the application was 35 μm, followed by drying. The drying conditions were set as follows: drying temperature 105° C., and drying time: 1.2 minutes. By doing this, an adhesive film 1 was obtained.

<Preparation of Adhesive Films of Examples 12 to 19>

Adhesive films 2 to 9 of Examples 12 to 19 were prepared according to the method for preparing the adhesive film 1 except that the varnishes A2 to A9 were used.

<Preparation of Adhesive Films of Comparative Examples 11 to 17>

Adhesive films 10 to 16 of Comparative Examples 11 to 17 were prepared according to the method for preparing the adhesive film 1 except that the varnishes A10 to A16 were used.

<Preparation of Multilayer Printed Wiring Board of Example 11>

On a copper clad laminate plate (described below) with a copper foil of 18 μm and a plate thickness of 0.4 mm having a circuit board formed in advance thereon, the adhesive film 1 was laminated using a laminator. After the lamination, the support (layer C) was peeled off, and the laminate was placed in a dry atmosphere set at 180° C. for 60 minutes to cure the layer A and the layer B, whereby a circuit board with an insulating layer including the layer A and the layer B was obtained.

As the copper clad laminate plate, "MCL-E-679F" (manufactured by Hitachi Chemical Co., Ltd.) was used. Further, as the laminator, a batch-type vacuum pressure laminator "MVLP-500" (manufactured by Meiki Co., Ltd.) was used. The lamination conditions were set as follows: vacuum degree: 30 mmHg or less, temperature: 90° C., and pressure: 0.5 MPa.

Subsequently, a via-hole was formed by laser processing at a given site in the insulating layer. As the laser processing machine, a carbon dioxide gas laser processing machine "LCO-1B21" (manufactured by Hitachi Via Mechanics Ltd.) was used. The formation conditions were set as follows: beam diameter: 60 μm, frequency: 500 Hz, pulse width: 5 μs, and shot count: 2. By doing this, a circuit board 1 having a hole formed therein was obtained.

<Preparation of Multilayer Printed Wiring Boards of Examples 12 to 19>

Circuit boards 2 to 9 having a hole formed therein of Examples 12 to 19 were prepared according to the method for preparing the circuit board 1 having a hole formed therein of Example 11 except that the adhesive films 2 to 9 were used.

<Preparation of Multilayer Printed Wiring Boards of Comparative Examples 11 to 17>

Circuit boards 10 to 16 having a hole formed therein of Comparative Examples 11 to 17 were prepared according to the method for preparing the circuit board 1 having a hole formed therein of Example 11 except that the adhesive films 10 to 16 were used.

<Preparation of Circuit Board for Measuring Surface Roughness of Example 11>

A circuit board for measuring a surface roughness was prepared from a part of a plurality of the prepared circuit boards 1 having a hole formed therein. For the circuit board 1 having a hole formed therein, a desmear treatment of the via-hole was performed under the following conditions. That is, a circuit board piece was immersed in a swelling solution heated to 80° C. for 3 minutes. Subsequently, the circuit board 1 having a hole formed therein was immersed in a roughening solution heated to 80° C. for 8 minutes, and thereafter immersed in a neutralizing solution heated to 45° C. for 5 minutes. By doing this, a circuit board 1 having undergone the desmear treatment was obtained.

As the swelling solution, "CIRCUPOSIT MLB CONDITIONER 211" (manufactured by Rohm & Haas Electronic Materials CMP, Inc.) was used.

As the roughening solution, "CIRCUPOSIT MLB PROMOTER 213" (manufactured by Rohm & Haas Electronic Materials CMP, Inc.) was used. As the neutralizing solution, "CIRCUPOSIT MLB NEUTRALIZER MLB 216" (manufactured by Rohm & Haas Electronic Materials CMP, Inc.) was used.

<Preparation of Circuit Boards for Measuring Surface Roughness of Examples 12 to 19>

Circuit boards 2 to 9 having undergone the desmear treatment of Examples 12 to 19 were prepared according to the method for preparing the circuit board 1 having undergone the desmear treatment of Example 1 except that the circuit boards 2 to 9 having a hole formed therein were used.

<Preparation of Circuit Boards for Measuring Surface Roughness of Comparative Examples 11 to 17>

Circuit boards 10 to 16 having undergone the desmear treatment of Comparative Examples 11 to 17 were prepared according to the method for preparing the circuit board 1 having undergone the desmear treatment of Example 1 except that the circuit boards 10 to 16 having a hole formed therein were used.

<Preparation of Circuit Board for Measuring Adhesion Strength of Example 11>

A circuit board for measuring an adhesion strength was prepared from the circuit board 1 having undergone the desmear treatment. The circuit board 1 having undergone the desmear treatment was treated so as to form a conductive layer described below. That is, the circuit board 1 having undergone the desmear treatment was immersed in a catalyst solution for electroless plating at room temperature (25° C.) for 10 minutes, washed with water at room temperature (25° C.), and then, immersed in a plating solution at room temperature (25° C.) for 15 minutes. By doing this, an electroless plating having a thickness of about 0.5 μm was formed on the surface of the insulating layer of the circuit board having undergone the desmear treatment. Subsequently, a copper layer having a thickness of about 25 μm was formed by electrolytic plating on the circuit board 1 having undergone the desmear treatment after the electroless plating treatment. Then, a resist having a width of 1 mm was formed on the circuit board having undergone the desmear treatment after the electrolytic plating, and the copper layer was etched with ferric chloride, whereby a circuit board 1 having a conductor layer formed thereon was obtained.

As the catalyst solution for electroless plating, a catalyst solution for electroless plating containing $PdCl_2$ "HS-202B" (manufactured by Hitachi Chemical Co., Ltd.) was used.

As the plating solution, "CUST-201" (manufactured by Hitachi Chemical Co., Ltd.) was used.

<Preparation of Circuit Boards for Measuring Adhesion Strength of Examples 12 to 19>

Circuit boards 2 to 9 having a conductor layer formed thereon of Examples 12 to 19 were prepared according to the method for preparing the circuit board 1 having a conductor layer formed thereon of Example 11 except that the circuit boards 2 to 9 having undergone the desmear treatment were used.

<Preparation of Circuit Boards for Measuring Adhesion Strength of Comparative Examples 11 to 17>

Circuit boards 10 to 16 having a conductor layer formed thereon of Comparative Examples 11 to 17 were prepared according to the method for preparing the circuit board 1 having a conductor layer formed thereon of Example 1 except that the circuit boards 10 to 16 having undergone the desmear treatment were used.

<Evaluation of Application State>

The application state of the layer A formed on the surface of the layer C was evaluated. The application state was visually observed. In the laminates 1 to 16, the presence or absence of a portion where the film thickness of the layer A formed on the surface of the layer C is lacking (so-called crawling) or a portion where the film thickness is zero (so-called pin hole) was observed. A case where crawling or a pin hole was observed was evaluated as "present", and a case where no crawling or pin hole was observed was evaluated as "absent". The results are shown in Table 3.

<Evaluation of Effect of Desmear Treatment/Evaluation of Laser Processability>

After the circuit boards 1 to 16 having a hole formed therein were subjected to a desmear treatment, a peripheral region of the via-hole was observed by an electron microscope, and the cross-sectional shape and the surface profile of the via-hole were observed by an electron microscope. A case where resin scattering was remarkable or the shape of the via-hole was irregular was evaluated as "bad", and the other cases were evaluated as "good". The results are shown in Table 4.

As the electron microscope, "SEM S4700" (manufactured by Hitachi, Ltd.) was used.

<Evaluation of Peel Strength>

For the respective circuit boards 1 to 16 having a conductor layer formed thereon, the adhesion strength between the insulating layer and the conductor layer was evaluated. The adhesion strength was expressed as a peel strength.

For each of the circuit boards 1 to 16 having a conductor layer formed thereon, one end of the copper layer formed on the insulating layer was peeled off from the insulating layer and gripped by a gripper. Then, a load was applied thereto in the direction vertical to the surface of the insulating layer at a tension rate of 50 mm/min at room temperature, and a load when the copper layer was peeled off was measured. A case where the adhesion strength (peel strength) was 0.6 kN/m or more was evaluated as "good". The results are shown in Table 4.

<Measurement of Surface Roughness>

The surface roughness (Ra) of the insulating layer of each of the circuit boards 1 to 16 having undergone the desmear treatment was measured. In the measurement, "Micromap MN5000" (manufactured by Ryoka Systems, Inc.) was used. As the value of the surface roughness (Ra) is smaller, the wiring width in the printed wiring can be reduced, and therefore, a smaller value is preferred. A case where the surface roughness was less than 0.3 μm was evaluated as "good". The results are shown in Table 4.

<Evaluation Results>

In the evaluation of the application state, the results of the laminates 1 to 9 correspond to Examples 11 to 19, respectively. Further, the results of the laminates to 16 correspond to Comparative Examples 11 to 17, respectively.

In the evaluation of the shape of the via-hole, the results of the circuit boards 1 to 9 having a hole formed therein correspond to Examples 11 to 19, respectively. Further, the results of the circuit boards 10 to 16 having a hole formed therein correspond to Comparative Examples 11 to 17, respectively.

In the evaluation of the peel strength, the results of the circuit boards 1 to 9 having a conductor layer formed thereon correspond to Examples 11 to 19, respectively. Further, the results of the circuit boards 10 to 16 having a conductor layer formed thereon correspond to Comparative Examples 11 to 17, respectively.

In the measurement of the surface roughness, the results of the circuit boards 1 to 9 having undergone the desmear treatment correspond to Examples 11 to 19, respectively. Further, the results of the circuit boards 10 to 16 having undergone the desmear treatment correspond to Comparative Examples 11 to 17, respectively.

From the results shown in Table 4, it was found that in Examples 11 to 19, no crawling or pin hole was observed in the layer A applied to the layer C serving as the support, and therefore, the application state was favorable. It was also found that the cross-sectional shape of the via-hole formed in the circuit board was also favorable, and therefore, the processability was excellent. Further, in Examples 11 to 19, the peel strength of the conductor layer formed on the insulating layer was 0.6 kN/m or more in each case. Further, in Examples 11 to 19, the surface roughness of the insulating layer was less than 0.3 μm, and therefore, it was found that the insulating layer was in a state which can be determined to be substantially smooth.

On the other hand, the multilayer printed wiring boards of Comparative Examples 11 to 17 were evaluated as bad in terms of any of the application state, the shape of the via-hole, and the peel strength. The multilayer printed wiring board of Comparative Example 7 was evaluated as good in terms of the application state, the shape of the via-hole, and the peel strength, but the surface roughness of the multilayer printed wiring board of Comparative Example 7 was 0.41 μm.

From the above results, it was found that in the multilayer printed wiring boards of Examples 11 to 19, the shape of the via-hole was favorable, and the smear after the desmear treatment was sufficiently removed, and therefore, the laser processability was excellent. Further, the multilayer printed wiring boards of Examples 11 to 19 can keep a smooth state such that the surface roughness is 0.3 μm or less even after the desmear treatment. Accordingly, it was found that the multilayer printed wiring boards of Examples 11 to 19 can keep the surface of the adhesive film substantially smooth even if the desmear treatment is performed such that the smear remaining in the via-hole is completely removed. It was also found that the multilayer printed wiring boards of Examples 11 to 19 can have a sufficient adhesion strength between the adhesive film and the conductor layer.

Accordingly, the multilayer printed wiring boards of Examples 11 to 19 can sufficiently meet the demand for

TABLE 4

| Evaluation item | | Example 11 | Example 12 | Example 13 | Example 14 | Example 15 | Example 16 | Example 17 | Example 18 | Example 19 |
| --- | --- | --- | --- | --- | --- | --- | --- | --- | --- | --- |
| Application state | Present/Absent | Absent | Absent | Absent | Absent | Absent | Absent | Absent | Absent | Absent |
| Desmear treatment | Good/Bad | Good | Good | Good | Good | Good | Good | Good | Good | Good |
| Shape of via-hole | Good/Bad | Good | Good | Good | Good | Good | Good | Good | Good | Good |
| Peel strength | kN/m | 0.71 | 0.70 | 0.67 | 0.69 | 0.64 | 0.71 | 0.72 | 0.72 | 0.64 |
| Surface roughness | μm | 0.20 | 0.21 | 0.20 | 0.29 | 0.17 | 0.22 | 0.26 | 0.24 | 0.18 |

| | Evaluation item | | Comparative Example 11 | Comparative Example 12 | Comparative Example 13 | Comparative Example 14 | Comparative Example 15 | Comparative Example 16 | Comparative Example 17 |
| --- | --- | --- | --- | --- | --- | --- | --- | --- | --- |
| | Application state | Present/Absent | Absent | Absent | Present | Absent | Absent | Absent | Absent |
| | Desmear treatment | Good/Bad | Good | Good | Good | Good | Good | Good | Good |
| | Shape of via-hole | Good/Bad | Good | Good | Good | Good | Bad | Good | Good |
| | Peel strength | kN/m | 0.42 | 0.27 | 0.71 | 0.41 | 0.72 | 0.12 | 0.72 |
| | Surface roughness | μm | 0.29 | 0.39 | 0.24 | 0.14 | 0.26 | 0.18 | 0.41 | further reduction in the wiring width in the printed wiring formed on the multilayer printed wiring board.

[Examples Using Adhesive Film According to Third Embodiment]

Hereinafter, the present invention will be specifically described by showing a third example, however, the present invention is not limited thereto.

<Preparation of Varnish for Forming Layer A>

Varnishes A21 to A34

Varnishes A21 to A34 were prepared by mixing the respective components (a), (b), (c), and (e) and the organic solvent shown in the following Table 5 in blending amounts shown therein, and performing a bead mill dispersion treatment.

TABLE 5

| Parts by mass (solid content (parts by mass)) | | Concentration (%) | A21 | A22 | A23 | A24 | A25 | A26 | A27 | A28 | A29 | A30 |
|---|---|---|---|---|---|---|---|---|---|---|---|---|
| Component (a) | a-1 | 10 | 136.8 (13.7) | 136.8 (13.7) | 136.8 (13.7) | 73.0 (7.3) | 228.0 (22.8) | 142.0 (14.2) | 113.3 (11.3) | 136.8 (13.7) | 0.0 (0.0) | 638.4 (63.8) |
| Component (b) | b-1 | 100 | 55.3 (55.3) | 61.2 (61.2) | 44.2 (44.2) | 60.4 (60.4) | 47.9 (47.9) | 57.4 (57.4) | 45.8 (45.8) | 55.3 (55.3) | 66.4 (66.4) | 16.6 (16.6) |
| | b-2 | 60 | 20.9 (12.6) | 23.2 (13.9) | 16.8 (10.1) | 22.9 (13.7) | 18.2 (10.9) | 21.7 (13.0) | 17.4 (10.4) | 20.9 (12.6) | 25.1 (15.1) | 6.3 (3.8) |
| | b-3 | 100 | 0.6 (0.6) | 0.6 (0.6) | 0.4 (0.4) | 0.6 (0.6) | 0.5 (0.5) | 0.6 (0.6) | 0.5 (0.5) | 0.6 (0.6) | 0.7 (0.7) | 0.2 (0.2) |
| Component (c) | c-1 | 100 | 8.8 (8.8) | 8.8 (8.8) | 8.8 (8.8) | 8.8 (8.8) | 8.8 (8.8) | 5.4 (5.4) | 24.4 (24.4) | 8.8 (8.8) | 8.8 (8.8) | 8.8 (8.8) |
| Component (d) | d-1 | 15 | 60.8 (9.1) | 12.2 (1.8) | 152.1 (22.8) | 60.8 (9.1) | 60.7 (9.1) | 63.1 (9.5) | 50.4 (7.6) | 0.0 (0.0) | 60.6 (9.1) | 45.4 (6.8) |
| | d-2 | 15 | 0.0 (0.0) | 0.0 (0.0) | 0.0 (0.0) | 0.0 (0.0) | 0.0 (0.0) | 0.0 (0.0) | 0.0 (0.0) | 60.8 (9.1) | 0.0 (0.0) | 0.0 (0.0) |
| Total solid amount | | | 100.0 | 100.0 | 100.0 | 100.0 | 100.0 | 100.0 | 100.0 | 100.0 | 100.0 | 100.0 |
| Organic solvent | | | 272.4 | 312.8 | 196.5 | 329.0 | 191.5 | 265.5 | 303.8 | 272.4 | 394.0 | 0.0 |
| (a):(b) | | | 1:5 | 1:5.5 | 1:4 | 1:10.2 | 1:2.6 | 1:5 | 1:5 | 1:5 | 0.0 | 1:0.3 |
| ((a) + (b)):(c) | | | 1:0.1 | 1:0.1 | 1:0.13 | 1:0.11 | 1:0.10 | 1:0.06 | 1:0.36 | 1:0.1 | 1:0.1 | 1:0.1 |
| (a):(d) | | | 1:1.5 | 1:7.6 | 1:0.6 | 1:0.8 | 1:2.5 | 1:1.5 | 1:5 | 1:1.5 | — | 1:9.4 |
| Total mass % of (a) to (d) | | | 100.0 | 100.0 | 100.0 | 100.0 | 100.0 | 100.0 | 100.0 | 100.0 | 100.0 | 100.0 |

| Parts by mass (solid content (parts by mass)) | | Concentration (%) | A31 | A32 | A33 | A34 |
|---|---|---|---|---|---|---|
| Component (a) | a-1 | 10 | 136.8 (13.7) | 54.7 (5.5) | 150.0 (15.0) | 52.9 (5.3) |
| Component (b) | b-1 | 100 | 62.7 (62.7) | 7.6 (7.6) | 60.6 (60.6) | 21.4 (21.4) |
| | b-2 | 60 | 23.7 (14.2) | 2.9 (1.7) | 23.0 (13.8) | 8.1 (4.9) |
| | b-3 | 100 | 0.6 (0.6) | 0.1 (0.1) | 0.6 (0.6) | 0.2 (0.2) |
| Component (c) | c-1 | 100 | 8.8 (8.8) | 8.8 (8.8) | 0.0 (0.0) | 64.7 (64.7) |
| Component (d) | d-1 | 15 | 0.0 (0.0) | 508.6 (76.3) | 66.7 (10.0) | 23.5 (3.5) |
| | d-2 | 15 | 0.0 (0.0) | 0.0 (0.0) | 0.0 (0.0) | 0.0 (0.0) |
| Total solid amount | | | 100.0 | 100.0 | 100.0 | 100.0 |
| Organic solvent | | | 322.9 | 0.0 | 254.7 | 384.7 |
| (a):(b) | | | 1:5.7 | 1:1.7 | 1:5 | 1:5 |
| ((a) + (b)):(c) | | | 1:0.1 | 1:0.6 | — | 1:2.0 |
| (a):(d) | | | — | 1:0.08 | 1:1.5 | 1:1.5 |
| Total mass % of (a) to (d) | | | 100.0 | 100.0 | 100.0 | 100.0 |

The respective components in Table 5 are as follows.

a-1: a polyamide resin "BPAM-155" (manufactured by Nippon Kayaku Co., Ltd.)

b-1: a biphenyl-type epoxy resin "NC3000-H" (manufactured by Nippon Kayaku Co., Ltd.)

b-2: a curing agent, a triazine-containing phenolic novolac resin "LA-1356-60P" (manufactured by DIC Corporation)

b-3: a curing accelerator, 2-phenylimidazole (manufactured by Shikoku Chemicals Corporation)

c-1: fumed silica "AEROSIL R972" (manufactured by Japan Aerosil Co., Ltd.)

d-1: a phenoxy resin (having a fluorene backbone) "FX-293" (manufactured by Nippon Steel Chemical Co., Ltd.)

d-2: a phenoxy resin "YP-50" (manufactured by Nippon Steel Chemical Co., Ltd.)

Organic solvent: dimethylacetamide

<Preparation of Layer B>

A varnish B for forming the layer B was prepared by mixing the respective components shown in the following Table 6 in blending amounts shown therein, and performing a bead mill dispersion treatment.

TABLE 6

| Parts by mass (solid content (parts by mass)) | Concentration (%) | Varnish B |
|---|---|---|
| Component (e) | 100 | 31.8 (31.8) |
| Component (f) | 50 | 7.2 (3.6) |
| Component (g) | 100 | 5.1 (5.1) |
| Component (h) | 100 | 4.4 (4.4) |
| Component (i) | 100 | 0.1 (0.1) |
| Component (j) | 70 | 78.6 (55.0) |
| Total solid amount | | 100.0 |
| Organic solvent | | 42.7 |

The respective components in Table 6 are as follows.

e: a biphenyl-type epoxy resin "NC3000-H"

f: a curing agent, triazine-containing cresol novolac "LA-3018-50P" (manufactured by DIC Corporation)

g: a phosphorus-containing phenolic resin "HCA-HQ-HS" (manufactured by SANKO Company Limited)

h: a phenol novolac resin "TD2131" (manufactured by DIC Corporation)

i: a curing accelerator, 1-cyanoethyl-2-phenyl imidazolium trimellitate "2PZ-CNS-PW" (manufactured by Shikoku Chemicals Corporation)

j: a filler, a silica filler "SO-C2" (manufactured by Admafine Techno) (average particle diameter: 0.5 µm) treated with an aminosilane coupling agent in a methyl isobutyl ketone solvent Organic solvent: dimethylacetamide <Preparation of Adhesive Film of Example 21>

As the support (layer C), a polyethylene terephthalate film (PET film) having a thickness of 38 µm was used. On the surface of the PET film, the varnish A1 was applied using a comma coater so that the thickness after the application was 5 µm, followed by drying. The drying conditions were set as follows: drying temperature: 140° C., and drying time: 3 minutes. By doing this, a laminate 1 having the layer A formed by the varnish A1 and the layer C was formed.

Subsequently, the layer B was formed on the layer A of the thus obtained laminate 1. The method for forming the layer B is as follows. The varnish B for forming the layer B was applied to the laminate on the side of the layer A using a comma coater so that the thickness after the application was 35 followed by drying. The drying conditions were set as follows: drying temperature 105° C., and drying time: 1.2 minutes. By doing this, an adhesive film 1 was obtained.

<Preparation of Adhesive Films of Examples 22 to 28>

Adhesive films 2 to 8 of Examples 22 to 28 were prepared according to the method for preparing the adhesive film 1 except that the varnishes A22 to A28 were used.

<Preparation of Adhesive Films of Comparative Examples 21 to 26>

Adhesive films 9 to 14 of Comparative Examples 21 to 26 were prepared according to the method for preparing the adhesive film 1 except that the varnishes A29 to A34 were used.

<Preparation of Multilayer Printed Wiring Board of Example 21>

On a copper clad laminate plate (described below) with a copper foil of 18 µm and a plate thickness of 0.4 mm having a circuit board formed in advance thereon, the adhesive film 1 was laminated using a laminator. After the lamination, the support (layer C) was peeled off, and the laminate was placed in a dry atmosphere set at 180° C. for 60 minutes to cure the layer A and the layer B, whereby a circuit board with an insulating layer including the layer A and the layer B was obtained.

As the copper clad laminate plate, "MCL-E-679F" (manufactured by Hitachi Chemical Co., Ltd.) was used. Further, as the laminator, a batch-type vacuum pressure laminator "MVLP-500" (manufactured by Meiki Co., Ltd.) was used. The lamination conditions were set as follows: vacuum degree: 30 mmHg or less, temperature: 90° C., and pressure: 0.5 MPa.

Subsequently, a via-hole was formed by laser processing at a given site in the insulating layer. As the laser processing machine, a carbon dioxide gas laser processing machine "LCO-1B21" (manufactured by Hitachi Via Mechanics Ltd.) was used. The formation conditions were set as follows: beam diameter: 60 µm, frequency: 500 Hz, pulse width: 5 µs, and shot count: 2. By doing this, a circuit board 1 having a hole formed therein was obtained.

<Preparation of Multilayer Printed Wiring Boards of Examples 22 to 28>

Circuit boards 2 to 8 having a hole formed therein of Examples 22 to 28 were prepared according to the method for preparing the circuit board 1 having a hole formed therein of Example 21 except that the adhesive films 2 to 8 were used.

<Preparation of Multilayer Printed Wiring Boards of Comparative Examples 21 to 26>

Circuit boards 9 to 14 having a hole formed therein of Comparative Examples 21 to 26 were prepared according to the method for preparing the circuit board 1 having a hole formed therein of Example 21 except that the adhesive films 9 to 14 were used.

<Preparation of Circuit Board for Measuring Surface Roughness of Example 21>

A circuit board for measuring a surface roughness was prepared from a part of a plurality of the prepared circuit boards 1 having a hole formed therein. For the circuit board 1 having a hole formed therein, a desmear treatment of the via-hole was performed under the following conditions. That is, the circuit board 1 having a hole formed therein was immersed in a swelling solution heated to 80° C. for 3 minutes. Subsequently, the circuit board 1 having a hole formed therein was immersed in a roughening solution heated to 80° C. for 20 minutes, and thereafter immersed in a neutralizing solution heated to 45° C. for 5 minutes. By doing this, a circuit board 1 having undergone the desmear treatment was obtained.

As the swelling solution, "CIRCUPOSIT MLB CONDITIONER 211" (manufactured by Rohm & Haas Electronic Materials CMP, Inc.) was used.

As the roughening solution, "CIRCUPOSIT MLB PROMOTER 213" (manufactured by Rohm & Haas Electronic Materials CMP, Inc.) was used. As the neutralizing solution, "CIRCUPOSIT MLB NEUTRALIZER MLB 216" (manufactured by Rohm & Haas Electronic Materials CMP, Inc.) was used.

<Preparation of Circuit Boards for Measuring Surface Roughness of Examples 22 to 28>

Circuit boards 2 to 8 having undergone the desmear treatment of Examples 22 to 28 were prepared according to the method for preparing the circuit board 1 having undergone the desmear treatment of Example 21 except that the circuit boards 2 to 8 having a hole formed therein were used.

<Preparation of Circuit Boards for Measuring Surface Roughness of Comparative Examples 21 to 26>

Circuit boards 9 to 14 having undergone the desmear treatment of Comparative Examples 21 to 26 were prepared according to the method for preparing the circuit board 1 having undergone the desmear treatment of Example 1 except that the circuit boards 9 to 14 having a hole formed therein were used.

<Preparation of Circuit Board for Evaluating Occurrence of Blister of Example 21>

A circuit board for measuring a joining strength was prepared from the circuit board 1 having undergone the desmear treatment. The circuit board 1 having undergone the desmear treatment was treated so as to form a conductive layer described below. That is, the circuit board 1 having undergone the desmear treatment was immersed in a catalyst solution for electroless copper plating at room temperature (25° C.) for 10 minutes, washed with water at room temperature (25° C.), and then, immersed in a plating solution at room temperature (25° C.) for 15 minutes. By doing this, an electroless copper plating having a thickness of about 0.5 µm was formed on the surface of the insulating layer of the circuit board having undergone the desmear treatment, whereby a circuit board 1 for blister evaluation was obtained.

<Preparation of Circuit Boards for Evaluating Occurrence of Blister of Examples 22 to 28>

Circuit boards 2 to 8 for blister evaluation of Examples 22 to 28 were prepared according to the method for preparing the circuit board 1 for blister evaluation of Example 1 except that the circuit boards 2 to 8 having undergone the desmear treatment were used.

<Preparation of Circuit Boards for Evaluating Occurrence of Blister of Comparative Examples 21 to 26>

Circuit boards 9 to 14 for blister evaluation of Comparative Examples 21 to 26 were prepared according to the method for preparing the circuit board 1 for blister evaluation of Example 22 except that the circuit boards 9 to 14 having undergone the desmear treatment were used.

<Preparation of Circuit Board for Measuring Joining Strength of Example 21>

On the circuit board 1 for blister evaluation having an electroless copper plating formed thereon, a copper layer having a thickness of about 25 µm was further formed by electrolytic plating. Then, a resist having a width of 1 mm was formed thereon, and the copper layer was etched with ferric chloride, whereby a circuit board 1 having a conductor layer formed thereon was obtained.

As the catalyst solution for electroless copper plating, a catalyst solution for electroless copper plating containing $PdCl_2$ "HS-202B" (manufactured by Hitachi Chemical Co., Ltd.) was used.

As the plating solution, "CUST-201" (manufactured by Hitachi Chemical Co., Ltd.) was used.

<Preparation of Circuit Boards for Measuring Joining Strength of Examples 22 to 28>

Circuit boards 2 to 8 having a conductor layer formed thereon of Examples 22 to 28 were prepared according to the method for preparing the circuit board 1 having a conductor layer formed thereon of Example 21 except that the circuit boards 2 to 8 having undergone the desmear treatment were used.

<Preparation of Circuit Boards for Measuring Joining Strength of Comparative Examples 21 to 26>

Circuit boards 9 to 14 having a conductor layer formed thereon of Comparative Examples 21 to 26 were prepared according to the method for preparing the circuit board 1 having a conductor layer formed thereon of Example 21 except that the circuit boards 9 to 14 having undergone the desmear treatment were used.

<Evaluation of Effect of Desmear Treatment/Evaluation of Laser Processability>

A peripheral region of the via-hole of each of the circuit boards 1 to 14 having undergone the desmear treatment was observed by an electron microscope, and the cross-sectional shape and the surface profile of the via-hole were observed by an electron microscope. A case where resin scattering was remarkable or the shape of the via-hole was irregular was evaluated as "bad", and the other cases were evaluated as "good". The results are shown in Table 7.

As the electron microscope, "SEM S4700" (manufactured by Hitachi, Ltd.) was used.

<Evaluation Method for Presence or Absence of Occurrence of Blister>

By using the above-described electron microscope, the conductor layers of the circuit boards 1 to 14 for blister evaluation were observed. A case where swelling of the conductor layer was observed throughout the entire surface of the conductor layer was evaluated as "C", a case where swelling of the conductor layer was observed in a part (an edge region) of the conductor layer was evaluated as "B", and a case where no swelling of the conductor layer was observed was evaluated as "A". The results are shown in Table 7.

<Evaluation of Peel Strength>

For the respective circuit boards 1 to 14 having a conductor layer formed thereon, the joining strength between the insulating layer and the conductor layer was evaluated. The joining strength was expressed as a peel strength.

For each of the circuit boards 1 to 14 having a conductor layer formed thereon, one end of the copper layer formed on the insulating layer was peeled off from the insulating layer and gripped by a gripper. Then, a load was applied thereto in the direction vertical to the surface of the insulating layer at a tension rate of 50 mm/min at room temperature, and a load when the copper layer was peeled off was measured. A case where the joining strength (peel strength) was 0.6 kN/m or more was evaluated as "good". The results are shown in Table 7.

<Measurement of Surface Roughness>

The surface roughness (Ra) of the insulating layer of each of the circuit boards 1 to 14 having undergone the desmear treatment was measured. In the measurement, "Micromap MN5000" (manufactured by Ryoka Systems, Inc.) was used. As the value of the surface roughness (Ra) is smaller, the wiring width in the printed wiring can be reduced, and therefore, a smaller value is preferred. A case where the surface roughness was less than 0.4 µm was evaluated as "good". The results are shown in Table 7.

<Evaluation Results>

In the evaluation of the shape of the via-hole, the results of the circuit boards 1 to 8 having a hole formed therein correspond to Examples 21 to 28, respectively. Further, the results of the circuit boards 9 to 14 having a hole formed therein correspond to Comparative Examples 21 to 26, respectively.

In the evaluation of the presence or absence of the occurrence of a blister, the results of the circuit boards 1 to 8 for blister evaluation correspond to Examples 21 to 28, respectively. Further, the results of the circuit boards 9 to 14 for blister evaluation correspond to Comparative Examples 21 to 26, respectively.

In the evaluation of the peel strength, the results of the circuit boards 1 to 8 having a conductor layer formed thereon correspond to Examples 21 to 28, respectively. Further, the results of the circuit boards 9 to 14 having a conductor layer formed thereon correspond to Comparative Examples 21 to 26, respectively.

In the measurement of the surface roughness, the results of the circuit boards 1 to 8 having undergone the desmear treatment correspond to Examples 21 to 28, respectively. Further, the results of the circuit boards 9 to 14 having undergone the desmear treatment correspond to Comparative Examples 21 to 26, respectively.

From the above results, it was found that in the multilayer printed wiring boards of Examples 21 to 28, the shape of the via-hole is favorable, and the smear after the desmear treatment is sufficiently removed, and therefore, the laser processability is excellent. Further, the multilayer printed wiring boards of Examples 21 to 28 can keep the surface roughness 0.4 µm or less even after the desmear treatment. Accordingly, it was found that the multilayer printed wiring boards of Examples 21 to 28 can keep the surface of the adhesive film to have a surface roughness of 0.4 µm or less even if the desmear treatment is performed such that the smear remaining in the via-hole is completely removed. It was also found that the multilayer printed wiring boards of Examples 21 to 28 can have a sufficient joining strength between the adhesive film and the conductor layer.

Further, it could be confirmed that in the multilayer printed wiring boards of Examples 21 to 28, blister defects do not occur throughout the entire surface of the conductor layer.

Accordingly, the multilayer printed wiring boards of Examples 21 to 28 can sufficiently meet the demand for further reduction in the wiring width in the printed wiring formed on the multilayer printed wiring board.

TABLE 7

| Evaluation item | | Example 21 | Example 22 | Example 23 | Example 24 | Example 25 | Example 26 | Example 27 | Example 28 |
|---|---|---|---|---|---|---|---|---|---|
| Desmear treatment | Good/Bad | Good | Good | Good | Good | Good | Good | Good | Good |
| Shape of via-hole | Good/Bad | Good | Good | Good | Good | Good | Good | Good | Good |
| Blister | ABC | A | A | A | A | A | A | A | B |
| Peel strength | kN/m | 0.71 | 0.70 | 0.67 | 0.64 | 0.75 | 0.71 | 0.63 | 0.72 |
| Surface roughness | µm | 0.25 | 0.21 | 0.15 | 0.32 | 0.29 | 0.22 | 0.32 | 0.20 |

| Evaluation item | | Comparative Example 21 | Comparative Example 22 | Comparative Example 23 | Comparative Example 24 | Comparative Example 25 | Comparative Example 26 |
|---|---|---|---|---|---|---|---|
| Desmear treatment | Good/Bad | Good | Good | Good | Good | Bad | Good |
| Shape of via-hole | Good/Bad | Good | Good | Good | Good | Good | Good |
| Blister | ABC | A | A | C | A | A | A |
| Peel strength | kN/m | 0.34 | 0.29 | 0.69 | 0.37 | 0.70 | 0.41 |
| Surface roughness | µm | 0.18 | 0.29 | 0.39 | 0.09 | 0.14 | 0.42 |

From the results shown in Table 7, it was found that in the multilayer printed wiring boards of Examples 21 to 28, the cross-sectional shape of the via-hole formed in the circuit board was favorable, and therefore, the processability was excellent. Further, in Examples 21 to 28, the peel strength of the conductor layer formed on the insulating layer was 0.6 kN/m or more in each case. Further, in Examples 21 to 28, the surface roughness of the insulating layer was less than 0.4 µm.

On the other hand, the multilayer printed wiring boards of Comparative Examples 21 to 26 were evaluated as bad in terms of any of the peel strength, the surface roughness, and the presence or absence of a blister, although the shape of the via-hole was favorable.

The invention claimed is:

1. An adhesive film comprising a resin composition layer (layer A) for an interlayer insulating layer, a thermosetting resin composition layer (layer B), and a support film (layer C), wherein the layer C, the layer A, and the layer B are sequentially arranged in this order, the layer A is a resin composition which contains a thermosetting resin (a1) and an inorganic filler (b1) having a specific surface area of 80 m$^2$/g or more, the mass ratio of the thermosetting resin (a1) to the inorganic filler (b1) is within the range from 30:1 to 2:1, the layer B contains a thermosetting resin composition which is in a solid state at a temperature lower than 40° C. but is melted at a temperature of 40° C. or higher but lower than 140° C., and the layer B has a thickness from 10 to 100 µm, and the layer A has a composition different than a composition of the layer B.

2. The adhesive film according to claim 1, wherein the inorganic filler (b1) in the layer A is fumed silica and/or colloidal silica.

3. The adhesive film according to claim 2, wherein the inorganic filler (b1) in the layer A is a silica filler which has a spherical shape and is surface-treated so that the filler is uniformly dispersed in a solvent and/or an organic resin.

4. The adhesive film according to claim 1, wherein the layer A is a resin composition further containing a heat-resistant resin (c1), which is at least one resin selected from a polyamide resin, a polyamideimide resin, and a polyimide resin, and dissolves in an organic solvent, and the mass ratio of the thermosetting resin (a1) to the heat-resistant resin (c1) is within the range from 20:1 to 3:1.

5. The adhesive film according to claim 1, wherein the layer A is a resin composition which further contains a crosslinked organic filler (d1) having an average primary particle diameter of 1 μm or less in an amount such that the mass ratio of the thermosetting resin (a1) to the crosslinked organic filler (d1) is within the range from 20:1 to 3:1.

6. The adhesive film according to claim 1, wherein the layer B is a resin composition which contains an inorganic filler (b2) in an amount of 10 to 85% by mass.

7. The adhesive film according to claim 6, wherein the layer B contains spherical silica having an average particle diameter of 1μm or less as the inorganic filler (b2) in an amount of 50% by mass or more of the total inorganic filler in the layer B.

8. The adhesive film according to claim 1, wherein a polyfunctional epoxy resin is contained as the thermosetting resin (a1) in the layer A.

9. The adhesive film according to claim 1, wherein a thermosetting resin (a2) is contained in the layer B, and said thermosetting resin (a2) is a polyfunctional epoxy resin.

10. The adhesive film according to claim 1, wherein the thickness of the layer A is from 1 to 15 μm, and the thickness of the layer C is from 10 to 150 μm.

11. The adhesive film according to claim 1, wherein a protective film is provided on an outer surface of the layer B.

12. The adhesive film according to claim 1, wherein the layer A and the layer B are formed separately.

* * * * *